(12) United States Patent
Kosai et al.

(10) Patent No.: US 11,569,086 B2
(45) Date of Patent: Jan. 31, 2023

(54) SUBSTRATE PROCESSING APPARATUS AND SUBSTRATE PROCESSING METHOD

(71) Applicant: Tokyo Electron Limited, Tokyo (JP)

(72) Inventors: Kazuki Kosai, Kumamoto (JP); Kazuyoshi Shinohara, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 44 days.

(21) Appl. No.: 17/070,951

(22) Filed: Oct. 15, 2020

(65) Prior Publication Data
US 2021/0134590 A1 May 6, 2021

(30) Foreign Application Priority Data

Nov. 1, 2019 (JP) .............. JP2019-199988

(51) Int. Cl.
| | |
|---|---|
| H01L 21/02 | (2006.01) |
| C11D 7/08 | (2006.01) |
| H01L 21/67 | (2006.01) |
| B08B 3/04 | (2006.01) |

(52) U.S. Cl.
CPC ......... *H01L 21/02082* (2013.01); *B08B 3/04* (2013.01); *C11D 7/08* (2013.01); *H01L 21/02052* (2013.01); *H01L 21/67051* (2013.01)

(58) Field of Classification Search
CPC ................................... H01L 2/02082
See application file for complete search history.

(56) References Cited

U.S. PATENT DOCUMENTS

| | | | |
|---|---|---|---|
| 9,387,520 B2 | 7/2016 | Ogata et al. | |
| 2015/0168363 A1* | 6/2015 | Kondo | G01N 33/0039 73/30.01 |

FOREIGN PATENT DOCUMENTS

JP 2014-41994 A 3/2014

* cited by examiner

*Primary Examiner* — Jason Y Ko
(74) *Attorney, Agent, or Firm* — Xsensus LLP

(57) ABSTRACT

A substrate processing apparatus includes a substrate processing part that supplies a processing liquid from a processing liquid supply part to a mounted substrate to execute liquid processing, a liquid drainage part that has a recovery channel connected to a storage part that stores the processing liquid and drains the processing liquid used for the liquid processing, and a control unit executes a processing recipe for the liquid processing and a cleaning recipe for cleaning the substrate processing part and the liquid drainage part. The control unit executes a cleaning operation for supplying a cleaning liquid from a cleaning liquid supply part to clean the substrate processing part and the liquid drainage part and subsequently executes a return operation for supplying the processing liquid from the processing liquid supply part to replace the cleaning liquid attached to the substrate processing part and the liquid drainage part with the processing liquid.

15 Claims, 11 Drawing Sheets

(a) (b)

SUBSTRATE PROCESSING APPARATUS AND SUBSTRATE PROCESSING METHOD

CROSS-REFERENCE TO RELATED APPLICATIONS

The present application claims the benefit of priority to Japanese Patent Application No. 2019-199988 filed on Nov. 1, 2019, the contents of which are incorporated by reference herein in its entirety.

FIELD

Disclosed embodiments relate to a substrate processing apparatus and a substrate processing method.

BACKGROUND

A technique has conventionally been known that liquid-processes a substrate such as a semiconductor wafer (that will also be referred to as a wafer below) by a BHF (a buffered hydrofluoric acid) in a single-wafer-type substrate processing part (see Japanese Patent Application Publication No. 2014-041994).

SUMMARY

A substrate processing apparatus according to an aspect of the present disclosure includes a substrate processing part, a liquid drainage part, and a control unit. The substrate processing part supplies a processing liquid from a processing liquid supply part to a substrate that is mounted thereon to execute liquid processing thereof. The liquid drainage part has a recovery channel that is connected to a storage part that stores the processing liquid and drains the processing liquid that is used for the liquid processing. The control unit executes a processing recipe for the liquid processing and a cleaning recipe for cleaning the substrate processing part and the liquid drainage part. Furthermore, the control unit executes a cleaning operation for supplying a cleaning liquid from a cleaning liquid supply part to clean the substrate processing part and the liquid drainage part as the cleaning recipe and subsequently executes a return operation for supplying the processing liquid from the processing liquid supply part to replace the cleaning liquid that is attached to the substrate processing part and the liquid drainage part with the processing liquid.

DESCRIPTION OF EMBODIMENTS

Hereinafter, embodiments of a substrate processing apparatus and a substrate processing method as disclosed in the present application will be explained in detail, with reference to the accompanying drawings. Additionally, the present disclosure is not limited by each embodiment as illustrated below. Furthermore, the drawings are schematic and it has to be noted that a relationship among dimensions of respective elements, a ratio of respective elements, or the like may be different from reality. Moreover, among mutual drawings, parts with relationships among mutual dimensions or ratios that are different may be included.

A technique has conventionally been known that liquid-processes a substrate such as a semiconductor wafer (that will also be referred to as a wafer below) by a BHF (a buffered hydrofluoric acid) in a single-wafer-type substrate processing part. Additionally, a BHF is a mixed liquid of HF (hydrofluoric acid) and $NH_4F$ (ammonium fluoride).

In such liquid processing by a BHF, a problem that may occur is that a BHF that is scattered at a time of liquid processing and attached to a substrate processing part is crystalized and such a crystal is attached to a wafer as a particle(s). Hence, a cleaning process is periodically applied to a crystallized BHF by a cleaning liquid such as a DIW (a deionized water), so that attaching of a particle(s) that originate(s) from such a BHF to a wafer is prevented or reduced.

Furthermore, a BHF is a comparatively expensive chemical liquid, so that a BHF that is once used for liquid processing may be recovered from a liquid drainage part and in a storage part to use such a used BHF for liquid processing again.

However, a cleaning liquid (a DIW) is attached to and remains on a substrate processing part or a liquid drainage part after a cleaning process, so that, in a case where a BHF is recovered in a storage part together with such a DIW, a concentration of such a BHF may be lowered. Then, in a case where a concentration of a BHF is lowered, a performance of such a BHF in liquid processing may be degraded.

Hence, a technique is expected that is capable of overcoming a problem as described above and preventing or reducing degrading of a performance in liquid processing after a cleaning process is applied to a substrate processing part.

Outline of Substrate Processing System

Figure 1:
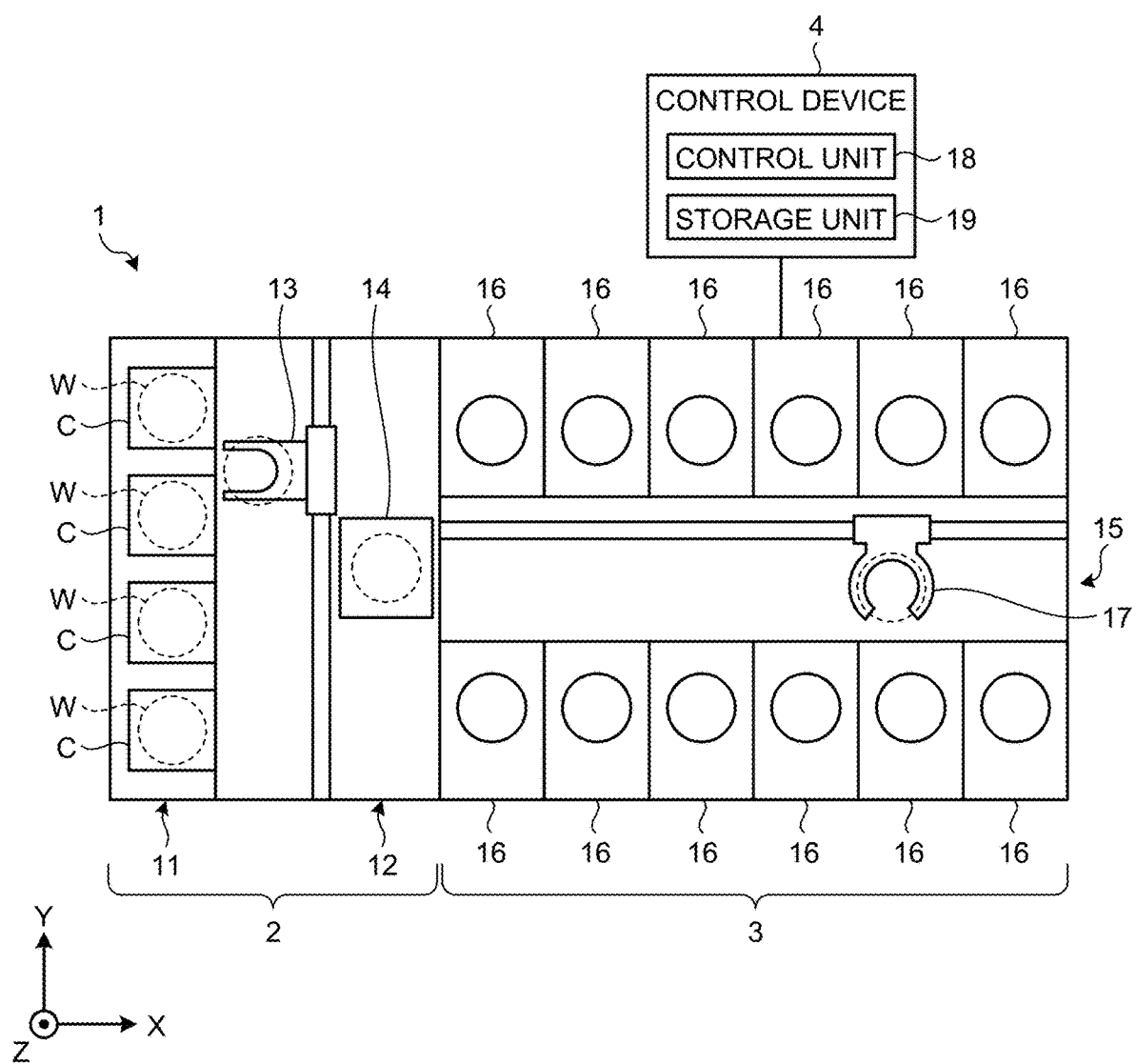
FIG. 1 is a schematic diagram that illustrates a general configuration of a substrate processing system according to an embodiment.

First, a schematic configuration of a substrate processing system 1 according to an embodiment will be explained with reference to FIG. 1. FIG. 1 is a diagram that illustrates a schematic configuration of the substrate processing system 1 according to an embodiment. Additionally, the substrate processing system 1 is an example of a substrate processing apparatus. Hereinafter, an X-axis, a Y-axis, and a Z-axis that are orthogonal to one another are specified in order to clarify a positional relationship where a positive direction of the Z-axis is provided as a vertically upward direction.

As illustrated in FIG. 1, the substrate processing system 1 includes a carry-in/out station 2 and a processing station 3. The carry-in/out station 2 and the processing station 3 are provided adjacently.

The carry-in/out station 2 includes a carrier mounting part 11 and a transfer part 12. A plurality of carriers C that house a plurality of substrates, in an embodiment, semiconductor wafers W (that will be referred to as wafers W below), in a horizontal state are mounted on the carrier mounting part 11.

The transfer part 12 is provided so as to be adjacent to the carrier mounting part 11 and includes a substrate transfer device 13 and a delivery part 14 in an inside thereof. The substrate transfer device 13 includes a wafer holding mechanism that holds a wafer W. Furthermore, the substrate transfer device 13 is capable of movement in a horizontal direction and a vertical direction and turn around a vertical axis, and executes transfer of a wafer W between a carrier C and the delivery part 14 by using a wafer holding mechanism.

The processing station 3 is provided so as to be adjacent to the transfer part 12. The processing station 3 includes a transfer part 15 and a plurality of processing units 16. The plurality of processing units 16 are provided side by side on both sides of the transfer part 15.

The transfer part 15 includes a substrate transfer device 17 in an inside thereof. The substrate transfer device 17 includes a wafer holding mechanism that holds a wafer W. Furthermore, the substrate transfer device 17 is capable of movement in a horizontal direction and a vertical direction and turn around a vertical axis, and executes transfer of a wafer W between the delivery part 14 and a processing unit 16 by using a wafer holding mechanism.

A processing unit 16 executes predetermined substrate processing for a wafer W that is transferred by the substrate transfer device 17.

Furthermore, the substrate processing system 1 includes a control device 4. The control device 4 is, for example, a computer and includes a control unit 18 and a storage unit 19. The storage unit 19 stores a program to control various types of processes that are executed in the substrate processing system 1. The control unit 18 reads and executes a program that is stored in the storage unit 19 so as to control an operation of the substrate processing system 1.

Additionally, such a program may be recorded in a computer-readable storage medium and be installed on the storage unit 19 of the control device 4 from such a storage medium. A computer-readable storage medium is, for example, a hard disk (HD), a flexible disk (FD), a compact disk (CD), a magnetooptical disk (MO), a memory card, or the like.

In the substrate processing system 1 that is configured as described above, first, the substrate transfer device 13 of the carry-in/out station 2 takes a wafer W from a carrier C that is mounted on the carrier mounting part 11 and mounts such a taken wafer W on the delivery part 14. A wafer W that is mounted on the delivery part 14 is taken from the delivery part 14 by the substrate transfer device 17 of the processing station 3 and is carried in a processing unit 16.

A wafer W that is carried in a processing unit 16 is processed by the processing unit 16, subsequently is carried out of the processing unit 16 by the substrate transfer device 17, and is mounted on the delivery part 14. Then, a processed wafer W that is mounted on the delivery part 14 is returned to a carrier C of the carrier mounting part 11 by the substrate transfer device 13.

Configuration of Processing Unit

Figure 2:
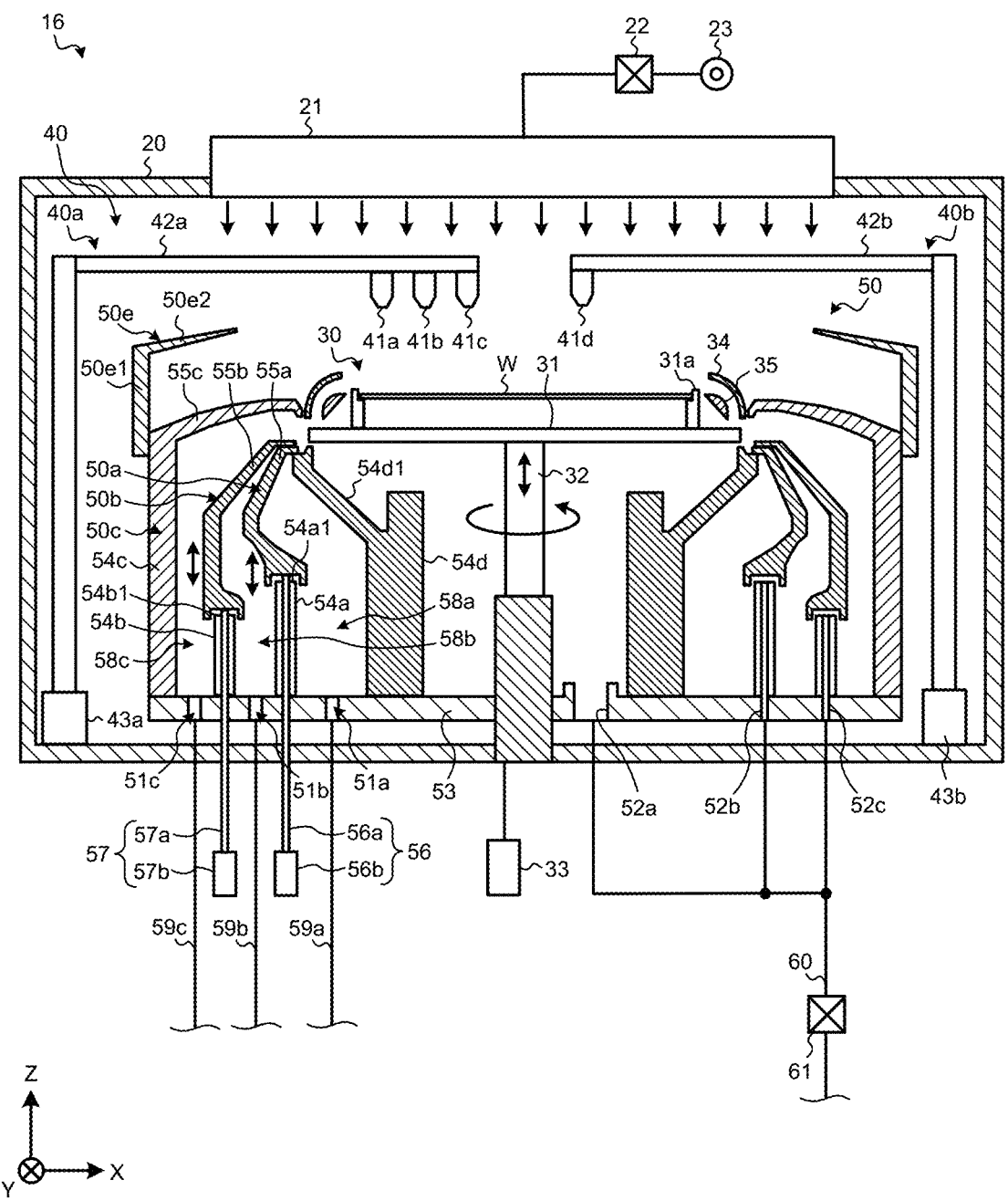
FIG. 2 is a schematic diagram that illustrates a configuration example of a processing unit according to an embodiment.

Next, a configuration of a processing unit 16 will be explained with reference to FIG. 2. FIG. 2 is a schematic diagram that illustrates a specific configuration example of the processing unit 16. As illustrated in FIG. 2, the processing unit 16 includes a chamber 20, a substrate processing part 30, a liquid supply part 40, and a liquid drainage part 50.

The chamber 20 houses at least a part of the substrate processing part 30, the liquid supply part 40, and the liquid drainage part 50. A FFU (Fan Filter Unit) 21 is provided at a ceiling part of the chamber 20. The FFU 21 forms a downflow in the chamber 20.

The FFU 21 is connected to a downflow gas supply source 23 thorough a valve 22. The FFU 21 discharges a downflow gas (for example, a dry air) that is supplied from the downflow gas supply source 23 into the chamber 20.

The substrate processing part 30 includes a rotation holding part 31, a support post part 32, and a driving part 33, and applies liquid processing to a mounted wafer W. The rotation holding part 31 is provided at a substantially center of the chamber 20. A holding member 31a that holds a wafer W on a side surface thereof is provided on an upper surface of the rotation holding part 31. A wafer W is held horizontally in a state where it is slightly separated from an upper surface of the rotation holding part 31 by such a holding member 31a.

The support post part 32 is a member that extends in a vertical direction, and is provided with a proximal part that is supported so as to be rotatable by the driving part 33 and a distal part that horizontally supports the rotation holding part 31. The driving part 33 rotates the support post part 32 around a vertical axis thereof.

Such a substrate processing part 30 rotates the support post part 32 by using the driving part 33 so as to rotate the rotation holding part 31 that is supported by the support post part 32 and thereby rotate a wafer W that is held by the rotation holding part 31.

The liquid supply part 40 includes a first liquid supply part 40a and a second liquid supply part 40b. The first liquid supply part 40a supplies various types of processing liquids to a wafer W that is held by the substrate processing part 30. Such a first liquid supply part 40a includes nozzles 41a to 41c, an arm 42a that horizontally supports the nozzles 41a to 41c, and a turning/lifting mechanism 43a that turns and lifts up or down the arm 42a.

The nozzles 41a to 41c are examples of a processing liquid supply part. From the nozzle 41a, a first BHF that has a first concentration of hydrofluoric acid is discharged to a front surface of a wafer W. From the nozzle 41b, a second BHF that has a second concentration of hydrofluoric acid is discharged to a front surface of a wafer W.

From the nozzle 41c, a third BHF that has a third concentration of hydrofluoric acid is discharged to a front surface of a wafer W. First to third BHFS are examples of a processing liquid. A pipe configuration of the substrate processing system 1 that includes such nozzles 41a to 41c will be described later.

The second liquid supply part 40b supplies a DIW to a wafer W that is heled by the substrate processing part 30. Such a second liquid supply part 40b includes a nozzle 41d, an arm 42b that horizontally supports the nozzle 41d, and a turning/lifting mechanism 43b that turns and lifts up or down the arm 42b.

From the nozzle 41d, a DIW that is supplied through a non-illustrated DIW supply channel is discharged to a front surface of a wafer W. A DIW is an example of a cleaning liquid and the nozzle 41d is an example of a cleaning liquid supply part.

First and second rotation cups 34, 35 that rotate integrally with the rotation holding part 31 are provided on a peripheral part of the rotation holding part 31. As illustrated in FIG. 2, the second rotation cup 35 is arranged on an inner side of the first rotation cup 34.

Such a first rotation cup 34 or second rotation cup 35 is generally formed into a ring shape. As the first and second rotation cups 34, 35 are rotated together with the rotation holding part 31, a processing liquid that is scattered from a rotating wafer W is guided to the liquid drainage part 50.

The liquid drainage part 50 includes a first cup 50a, a second cup 50b, a third cup 50c, and a mist guard 50e in order from an inner side that is close to a center of rotation of a rotating wafer W that is held by the rotation holding part 31. Furthermore, the liquid drainage part 50 further includes a bottom part 53, an inner wall part 54d, liquid drainage channels 59a to 59c, and recovery channels 64a to 64c (see FIG. 3).

The inner wall part 54d is a member with a circularly cylindrical shape that is arranged on an inner peripheral side of the first cup 50a and is centered at a center of rotation of a wafer W. The first to third cups 50a to 50c, the mist guard 50e, and the inner wall part 54d are provided on the bottom part 53 of the liquid drainage part 50.

The first cup 50a includes a first peripheral wall part 54a and a first liquid receiving part 55a. The first peripheral wall part 54a is provided so as to stand on the bottom part 53 and is formed into a cylindrical shape (for example, a circularly cylindrical shape). A space is formed between the first peripheral wall part 54a and the inner wall part 54d and such a space is provided as a first liquid drainage groove 58a for recovering and discharging a processing liquid or the like. The first liquid receiving part 55a is provided above an upper surface 54a1 of the first peripheral wall part 54a.

Furthermore, the first cup 50a includes a first lifting mechanism 56 and the first liquid receiving part 55a is configured so as to be liftable by such a first lifting mechanism 56. In detail, the first lifting mechanism 56 includes a first support member 56a and a first lifting driving part 56b.

The first support member 56a is a plurality of (for example, three, where only one thereof is illustrated in FIG. 2) members with an elongated shape. The first support member 56a is movably inserted through an insertion hole(s) that is/are formed in the first peripheral wall part 54a. Additionally, for the first support member 56a, it is possible to use, for example, a rod(s) with a circularly cylindrical shape, and this is not limiting.

The first support member 56a is located in such a manner that an upper end thereof is exposed at the upper surface 54a1 of the first peripheral wall part 54a, and is connected to a lower surface of the first liquid receiving part 55a so as to support the first liquid receiving part 55a from below. On the other hand, the first lifting driving part 56b is connected to a lower end of the first support member 56a.

The first lifting driving part 56b lifts up or down the first support member 56a, for example, in a direction of a Z-axis, and thereby, the first support member 56a lifts up or down the first liquid receiving part 55a with respect to the first peripheral wall part 54a. Additionally, for the first lifting driving part 56b, it is possible to use an air cylinder. Furthermore, the first lifting driving part 56b is controlled by the control device 4.

The first liquid receiving part 55a that is driven by the first lifting driving part 56b is moved between a processing position where a processing liquid that is scattered by a rotating wafer W is received and a retraction position where it is retracted from the processing position to a lower side.

In detail, in a case where the first liquid receiving part 55a is present at a processing position, an opening is formed inside an upper end of the first liquid receiving part 55a and a flow channel that leads from the opening to the first liquid drainage groove 58a is formed.

On the other hand, as illustrated in FIG. 2, the inner wall part 54d includes an extension part 54d1 that is provided to extend so as to slope toward a peripheral edge part of the rotation holding part 31. When the first liquid receiving part 55a is present at a retraction position, it contacts the extension part 54d1 of the inner wall part 54d and an opening inside an upper end thereof is closed so as to plug a flow channel that leads to the first liquid drainage groove 58a.

The second cup 50b is provided with a configuration that is similar to that of the first cup 50a. Specifically, the second cup 50b includes a second peripheral wall part 54b, a second liquid receiving part 55b, and a second lifting mechanism 57, and is arranged so as to be adjacent to a side of the first peripheral wall part 54a of the first cup 50a.

The second peripheral wall part 54b is provided so as to stand on the bottom part 53 on an outer peripheral side of the first peripheral wall part 54a and is formed into a cylindrical shape. Then, a space that is formed between the second peripheral wall part 54b and the first peripheral wall part 54a is provided as a second liquid drainage groove 58b for recovering and discharging a processing liquid or the like.

The second liquid receiving part 55b is located on an outer peripheral side of the first liquid receiving part 55a and is provided above an upper surface 54b1 of the second peripheral wall part 54b.

The second lifting mechanism 57 includes a second support member 57a and a second lifting driving part 57b. The second support member 57a is a plurality of (for example, three, where only one thereof is illustrated in FIG. 2) members with an elongated shape, and is movably inserted through an insertion hole(s) that is/are formed in the second peripheral wall part 54b. Additionally, for the second support member 57a, it is possible to use, for example, a rod(s) with a circularly cylindrical shape, and this is not limiting.

The second support member 57a is located in such a manner that an upper end thereof is exposed at the upper surface 54b1 of the second peripheral wall part 54b, and is connected to a lower surface of the second liquid receiving part 55b so as to support the second liquid receiving part 55b from below. Additionally, the upper surface 54b1 of the second peripheral wall part 54b is located so as to be below the upper surface 54a1 of the first peripheral wall part 54a in a vertical direction.

The second lifting driving part 57b is connected to a lower end of the second support member 57a. The second lifting driving part 57b lifts up or down the second support member 57a, for example, in a direction of a Z-axis. Thereby, the second support member 57a lifts up or down the second liquid receiving part 55b with respect to the second peripheral wall part 54b.

Additionally, for the second lifting driving part 57b, it is possible to use an air cylinder. Furthermore, the second lifting driving part 57b is controlled by the control device 4.

Then, the second liquid receiving part 55b is also moved between a processing position and a retraction position. In detail, when the second liquid receiving part 55b is present at a processing position and the first liquid receiving part 55a is present at a retraction position, an opening is formed inside an upper end of the second liquid receiving part 55b and a flow channel that leads from the opening to the second liquid drainage groove 58b is formed.

On the other hand, as illustrated in FIG. 2, when the second liquid receiving part 55b is present at a retraction position, it contacts the first liquid receiving part 55a and an opening inside an upper end thereof is closed so as to plug a flow channel that leads to the second liquid drainage groove 58b. Additionally, although the second liquid receiving part 55b at a retraction position contacts the first liquid receiving part 55a in the above, this is not limiting, and it may contact, for example, the inner wall part 54d so as to close an opening inside an upper end thereof.

The third cup 50c includes a third peripheral wall part 54c and a third liquid receiving part 55c, and is arranged so as to be adjacent to the second cup 50b on an opposite side of the first cup 50a. The third peripheral wall part 54c is provided so as to stand on the bottom part 53 on an outer peripheral side of the second peripheral wall part 54b and is formed into a cylindrical shape. Then, a space between the third peripheral wall part 54c and the second peripheral wall part 54b is provided as a third liquid drainage groove 58c for recovering and discharging a processing liquid or the like.

The third liquid receiving part 55c is formed so as to be continuous with an upper end of the third peripheral wall part 54c. The liquid receiving part 55c surrounds a periphery of a wafer W that is held by the rotation holding part 31 and is formed so as to extend to an upper side of the first liquid receiving part 55a or the second liquid receiving part 55b.

For the third liquid receiving part 55c, as illustrated in FIG. 2, when both the first and second liquid receiving parts 55a, 55b are present at retraction positions, an opening is formed inside an upper end of the third liquid receiving part 55c and a flow channel that leads from the opening to the third liquid drainage groove 58c is formed.

On the other hand, in a case where the second liquid receiving part 55b is present at an elevated position thereof or in a case where both the first liquid receiving part 55a and the second liquid receiving part 55b are present at elevated positions thereof, the second liquid receiving part 55b contacts the third liquid receiving part 55c and an opening inside an upper end thereof is closed so as to plug a flow channel that leads to the third liquid drainage groove 58c.

Liquid drainage ports 51a to 51c are spaced and formed along a circumference direction of the liquid drainage part 50 on the bottom part 53 so as to correspond to the first to third cups 50a to 50c as described above, accurately, on the bottom part 53 so as to the first to third liquid drainage grooves 58a to 58c, respectively.

The liquid drainage port 51a is connected to a liquid drainage channel 59a, the liquid drainage port 51b is connected to a liquid drainage channel 59b, and the liquid drainage port 51c is connected to a liquid drainage channel 59c. A pipe configuration of the substrate processing system 1 that includes such liquid drainage channels 59a to 59c will be described later.

Then, when substrate processing is executed, the substrate processing system 1 lifts up or down the first liquid receiving part 55a of the first cup 50a or the second liquid receiving part 55b of the second cup 50b, depending on a kind of a processing liquid that is used in each process during such substrate processing or the like, and executes switching of the liquid drainage ports 51a to 51c.

For example, in a case where a first BHF is discharged to a wafer W so as to process the wafer W, the control device 4 lifts up the first cup 50a and the second cup 50b. That is, the control device 4 lifts up the first and second support members 56a, 57a through the first and second lifting driving parts 56b, 57b, so as to lift up the first liquid receiving part 55a to a processing position and form a flow channel that leads from an opening inside an upper end of the first liquid receiving part 55a to the first liquid drainage groove 58a.

Thereby, a first BHF that is supplied to a wafer W flows into the first liquid drainage groove 58a.

Furthermore, for example, in a case where a second BHF is discharged to a wafer W so as to process the wafer W, the control device 4 lifts up only the second cup 50b. That is, the control device 4 lifts up the second support member 57a through the second lifting driving part 57b so as to lift up the second liquid receiving part 55b to a processing position and form a flow channel that leads from an opening inside an upper end of the second liquid receiving part 55b to the second liquid drainage groove 58b.

Additionally, the first cup 50a is lifted down herein. Thereby, a second BHF that is supplied to a wafer W flows into the second liquid drainage groove 58b.

Furthermore, for example, in a case where a third BHF is discharged to a wafer W so as to process the wafer W, the control device 4 lifts down the first and second cups 50a, 50b (see FIG. 2). That is, the control device 4 lifts down the first and second support members 56a, 57a through the first and second lifting driving parts 56b, 57b, so as to lift down the first and second liquid receiving parts 55a, 55b to retraction positions.

Thus, a flow channel that leads from an opening inside an upper end of the third liquid receiving part 55c to the third liquid drainage groove 58c is formed. Thereby, a third BHF that is supplied to a wafer W flows into the third liquid drainage groove 58c.

The mist guard 50e has an outer peripheral cylindrical part 50e1 and an overhanging part 50e2 that extends from an upper end part of such an outer peripheral cylindrical part 50e1 toward an inside of an outer peripheral cylindrical part 54e (in a radial direction thereof) and hangs over the third cup 50c. The mist guard 50e is configured to be liftable by a non-illustrated lifting mechanism.

The control unit 18 (see FIG. 1) arranges the mist guard 50e at a high position, so that it is possible to prevent or reduce arriving of a mist of a processing liquid that is scattered from a rotating wafer W at a side wall of the chamber 20.

Exhaust ports 52a, 52b, 52c are formed on the bottom part 53, the first peripheral wall part 54a, and the second peripheral wall part 54b of the liquid drainage part 50, respectively. Furthermore, the exhaust ports 52a, 52b, 52c are connected to a single exhaust pipe 60 and a valve 61 is inserted in such an exhaust pipe 60. Then, an atmosphere in the chamber 20 is exhausted through the exhaust ports 52a, 52b, 52c and the exhaust pipe 60.

Pipe Configuration of Substrate Processing System

Figure 3:
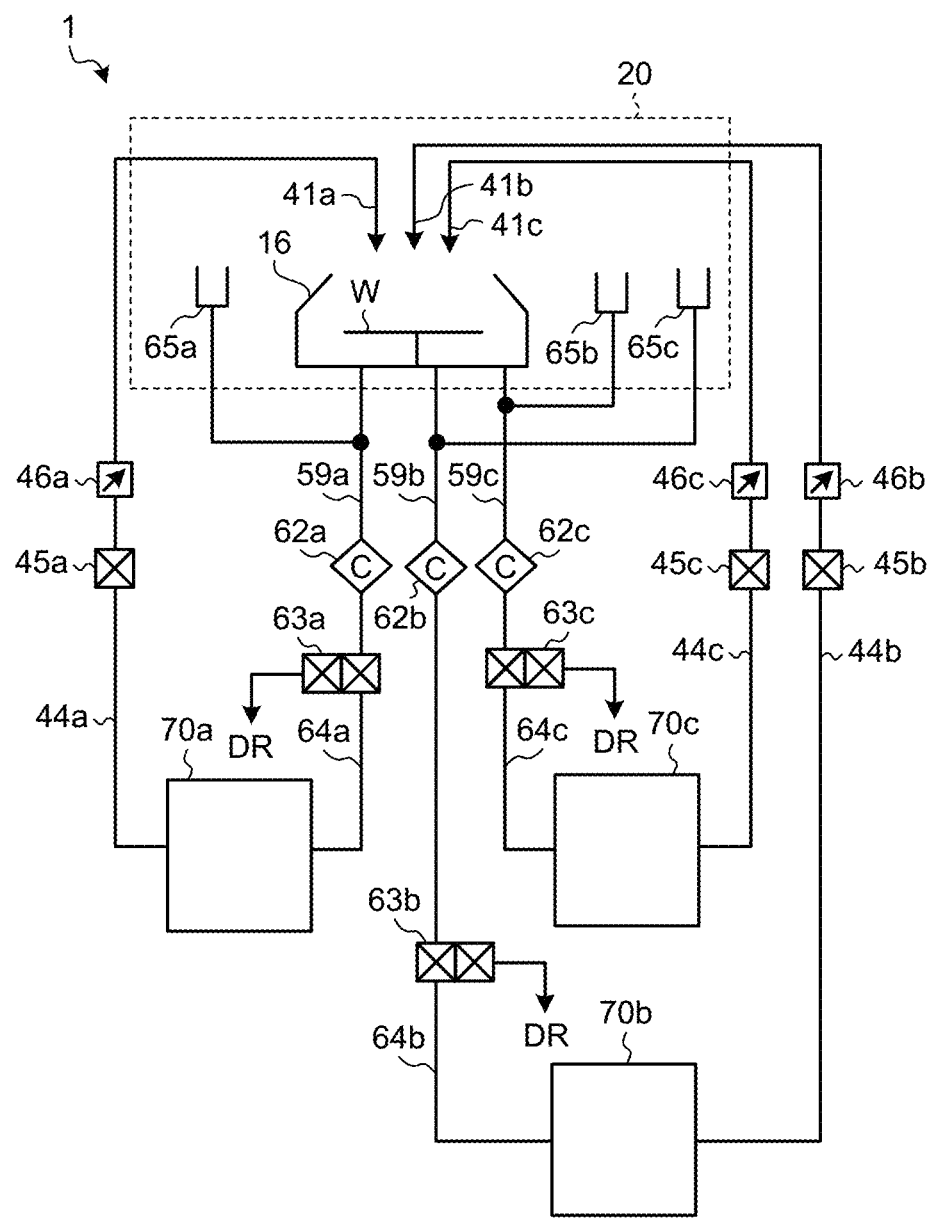
FIG. 3 is a schematic diagram that illustrates a pipe configuration of a substrate processing system according to an embodiment.

Next, a pipe configuration of the substrate processing system 1 will be explained with reference to FIG. 3 and FIG. 4. FIG. 3 is a schematic diagram that illustrates a pipe configuration of the substrate processing system 1 according to an embodiment.

As illustrated in FIG. 3, the liquid drainage channel 59a that is connected to the liquid drainage port 51a (see FIG. 2) of a processing unit 16 is connected to a switching valve 63a through a concentration sensor 62a. It is possible for the concentration sensor 62a to detect a concentration of hydrofluoric acid in a liquid drainage that flows through the liquid drainage channel 59a.

A drain part DR and a recovery channel 64a are connected to the switching valve 63a. Such a switching valve 63a is configured to be capable of switching a pipe that is connected to the liquid drainage channel 59a to the drain part DR or the recovery channel 64a. Then, the control unit 18 (see FIG. 1) controls the switching valve 63a, so that it is possible to switch a discharge route for a liquid drainage that flows through the liquid drainage channel 59a to the drain part DR or the recovery channel 64a.

Furthermore, the recovery channel 64a is connected to a storage part 70a that stores a first BHF. That is, the control unit 18 controls the switching valve 63a so as to cause conduction between the liquid drainage channel 59a and the recovery channel 64a, so that it is possible to recover a first BHF that is used in a processing unit 16 in the storage part 70a.

Then, a supply channel 44a is connected to the storage part 70a and such a supply channel 44a is connected to the nozzle 41a through a valve 45a and a flow rate regulator 46a. Thereby, it is possible for the control unit 18 to discharge a first BHF that is stored in the storage part 70a from the nozzle 41a to a wafer W. Additionally, details of the storage part 70a will be described later.

Furthermore, a waiting part 65a is provided below a waiting position for the nozzle 41a in the chamber 20. At a time of a dummy dispensing process that is intended for exclusion of a gas bubble(s), a foreign substance(s), or the like in each flow channel that is connected to the nozzle 41a, the waiting part 65a receives a first BHF that is discharged from the nozzle 41a and drains a received first BHF to an upstream side of the concentration sensor 62a on the liquid drainage channel 59a. That is, a liquid drainage channel of the waiting part 65a is connected to the liquid drainage channel 59a.

Furthermore, the liquid drainage channel 59b that is connected to the liquid drainage port 51b (see FIG. 2) of a processing unit 16 is connected to a switching valve 63b through a concentration sensor 62b. It is possible for the concentration sensor 62b to detect a concentration of hydrofluoric acid in a liquid drainage that flows through the liquid drainage channel 59b.

A drain part DR and a recovery channel 64b are connected to the switching valve 63b. Such a switching valve 63b is configured to be capable of switching a pipe that is connected to the liquid drainage channel 59b to the drain part DR or the recovery channel 64b. Then, the control unit 18 controls the switching valve 63b, so that it is possible to switch a discharge route for a liquid drainage that flows through the liquid drainage channel 59b to the drain part DR or the recovery channel 64b.

Furthermore, the recovery channel 64b is connected to a storage part 70b that stores a second BHF. That is, the control unit 18 controls the switching valve 63b so as to cause conduction between the liquid drainage channel 59b and the recovery channel 64b, so that it is possible to recover a second BHF that is used in a processing unit 16 in the storage part 70b.

Then, a supply channel 44b is connected to the storage part 70b and such a supply channel 44b is connected to the nozzle 41b through a valve 45b and a flow rate regulator 46b. Thereby, it is possible for the control unit 18 to discharge a second BHF that is stored in the storage part 70b from the nozzle 41b to a wafer W.

Furthermore, a waiting part 65b is provided below a waiting position for the nozzle 41b in the chamber 20. At a time of a dummy dispensing process that is intended for exclusion of a gas bubble(s), a foreign substance(s), or the like in each flow channel that is connected to the nozzle 41b, the waiting part 65b receives a second BHF that is discharged from the nozzle 41b and drains a received second BHF to an upstream side of the concentration sensor 62b on the liquid drainage channel 59b. That is, a liquid drainage channel of the waiting part 65b is connected to the liquid drainage channel 59b.

Moreover, the liquid drainage channel 59c that is connected to the liquid drainage port 51c (see FIG. 2) of a processing unit 16 is connected to a switching valve 63c through a concentration sensor 62c. It is possible for the concentration sensor 62c to detect a concentration of hydrofluoric acid in a liquid drainage that flows through the liquid drainage channel 59c.

A drain part DR and a recovery channel 64c are connected to the switching valve 63c. Such a switching valve 63c is configured to be capable of switching a pipe that is connected to the liquid drainage channel 59c to the drain part DR or the recovery channel 64c. Then, the control unit 18 controls the switching valve 63c, so that it is possible to switch a discharge route for a liquid drainage that flows through the liquid drainage channel 59c to the drain part DR or the recovery channel 64c.

Furthermore, the recovery channel 64c is connected to a storage part 70c that stores a third BHF. That is, the control unit 18 controls the switching valve 63c so as to cause conduction between the liquid drainage channel 59c and the recovery channel 64c, so that it is possible to recover a third BHF that is used in a processing unit 16 in the storage part 70c.

Then, a supply channel 44c is connected to the storage part 70c and such a supply channel 44c is connected to the nozzle 41c through a valve 45c and a flow rate regulator 46c. Thereby, it is possible for the control unit 18 to discharge a third BHF that is stored in the storage part 70c from the nozzle 41c to a wafer W.

Furthermore, a waiting part 65c is provided below a waiting position for the nozzle 41c in the chamber 20. At a time of a dummy dispensing process that is intended for exclusion of a gas bubble(s), a foreign substance(s), or the like in each flow channel that is connected to the nozzle 41c, the waiting part 65c receives a third BHF that is discharged from the nozzle 41c and drains a received third BHF to an upstream side of the concentration sensor 62c on the liquid drainage channel 59c. That is, a liquid drainage channel of the waiting part 65c is connected to the liquid drainage channel 59c.

Figure 4:
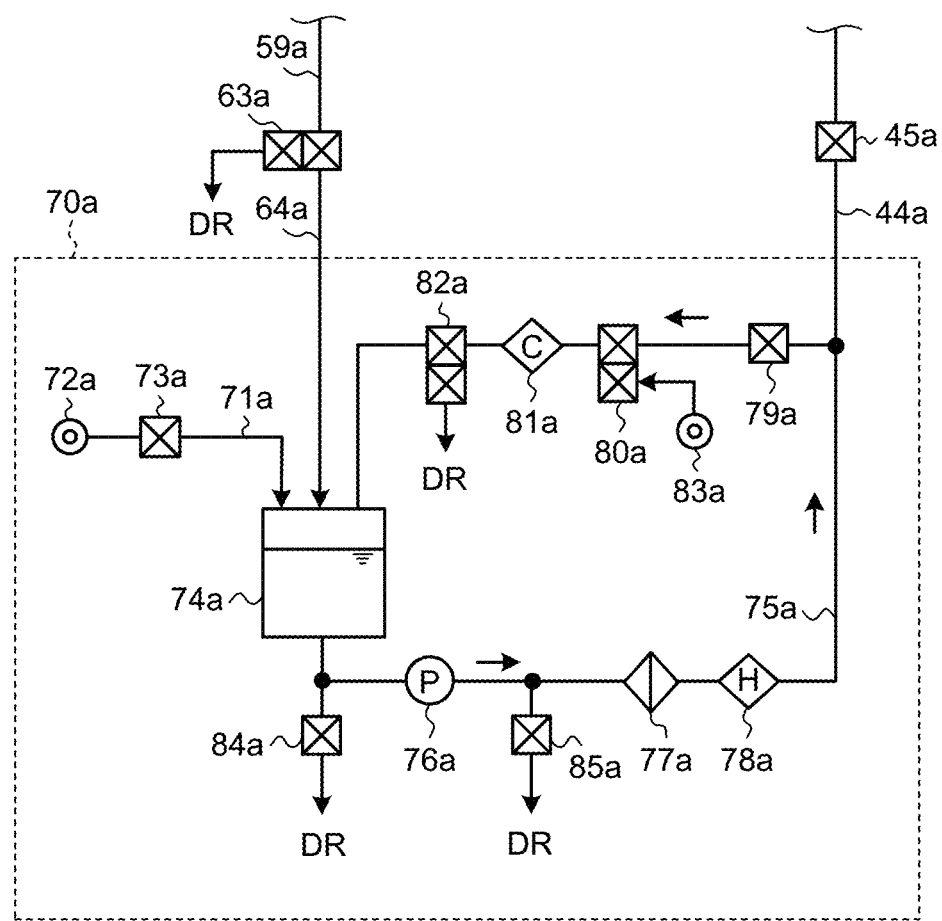
FIG. 4 is a schematic diagram that illustrates a pipe configuration of a storage part according to an embodiment.

FIG. 4 is a schematic diagram that illustrates a pipe configuration of a storage part 70a according to an embodiment. Additionally, pipe configurations of a storage part 70b and a storage part 70c are similar to a pipe configuration of the storage part 70a as explained below, so that an explanation of the pipe configurations of the storage part 70b and the storage part 70c will be omitted.

The storage part 70a has a BHF supply channel 71a, a tank 74a, and a circulation channel 75a. The BHF supply channel 71a supplies an unused first BHF to the tank 74a.

The BHF supply channel 71a has a BHF supply source 72a and a valve 73a in order from an upstream side. The BHF supply source 72a is, for example, a tank that stores an unused first BHF.

The tank 74a stores a first BHF that is supplied from the BHF supply channel 71a. Furthermore, the tank 74a stores a used first BHF that is recovered through the liquid drainage channel 59a and the recovery channel 64a.

The circulation channel 75a is a circulation channel that starts from the tank 74a and returns to such a tank 74a. The circulation channel 75a is provided with a pump 76a, a filter 77a, a heater 78a, a valve 79a, a switching valve 80a, a concentration sensor 81a, and a switching valve 82a, in order from an upstream side, with respect to the tank 74a.

The pump 76a forms a circulating flow of a first BHF that starts from the tank 74a, passes through the circulation channel 75a, and returns to the tank 74a. The filter 77a eliminates a contaminant(s) such as a particle(s) that is/are included in a first BHF that is circulated in the circulation channel 75a.

The heater 78a raises a temperature of a first BHF that is circulated in the circulation channel 75a. It is possible for the concentration sensor 81a to detect a concentration of hydrofluoric acid in a first BHF that flows through the circulation channel 75a.

Furthermore, a DIW supply source 83a is connected to an upstream side of the switching valve 80a and a drain part DR is connected to a downstream side of the switching valve 82a. Then, the control unit 18 (see FIG. 1) controls the switching valves 80a, 82a in such a manner that the DIW supply source 83a is connected to the drain part DR through the concentration sensor 81a, so that it is possible to clean an inside of the concentration sensor 81a with a DIW.

Therefore, according to an embodiment, an inside of the concentration sensor 81a is cleaned with a DIW, so that it is possible to calibrate the concentration sensor 81a.

Furthermore, the tank 74a is connected to the drain part DR through a valve 84a and the circulation channel 75a is connected to the drain part DR through a valve 85a. Thereby, when a first BHF in the tank 74a or in the circulation channel 75a is replaced or the like, the control unit 18 controls the valves 84a, 85a, so that it is possible to discharge a first BHF in the tank 74a or in the circulation channel 75a to the drain part DR.

Furthermore, the supply channel 44a is branched into the heater 78a and the valve 79a on the circulation channel 75a. Such a supply channel 44a is interposed and provided between the circulation channel 75a and the nozzle 41a (see FIG. 3) and a first BHF that is filtration-processed and temperature-adjustment-processed on the circulation channel 75a is supplied to a processing unit 16.

Substrate Processing

Figure 5:
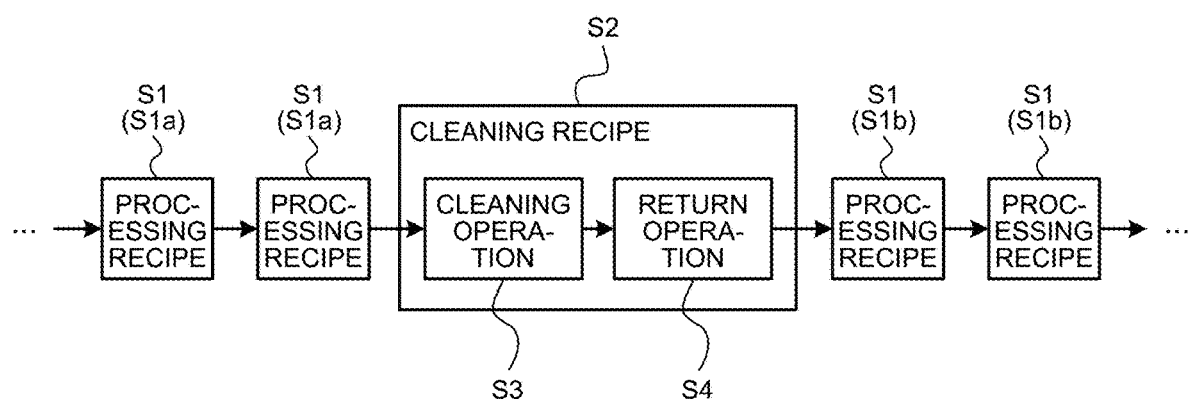
FIG. 5 is a diagram for explaining a flow of a process in a substrate processing system according to an embodiment.

Next, details of each process in the substrate processing system 1 according to an embodiment will be explained with reference to FIG. 5 to FIG. 7. FIG. 5 is a diagram for explaining a flow of a process in the substrate processing system 1 according to an embodiment.

As illustrated in FIG. 5, in the substrate processing system 1 according to an embodiment, liquid processing that uses one of first to third BHFS for a wafer W is continuously executed in a processing unit 16 according to a processing recipe S1 that corresponds to a BHF to be used.

Additionally, a processing recipe S1 according to an embodiment includes an order of processing for a wafer W and a kind of a processing liquid and is preliminarily stored in the storage unit 19 (see FIG. 1). That is, a plurality of proceeding recipes S1 according to an embodiment are prepared depending on different kinds of BHFS. Thereby, it is possible to execute liquid processing that is optimized for each of different kinds of BHFS in a processing unit 16.

Furthermore, in an example of FIG. 5, a processing recipe S1 of liquid processing that is executed before a cleaning recipe S2 that is a target is provided as a processing recipe S1a and a processing recipe S1 of liquid processing that is executed after the cleaning recipe S2 that is a target is provided as a processing recipe S1b.

Then, in the substrate processing system 1, a cleaning recipe S2 is executed in a processing unit 16 between an interval of processing recipes S1 that are executed repeatedly. Such a cleaning recipe S2 includes a cleaning operation S3 and a return operation S4.

A cleaning operation S3 is to supply a DIW that is a cleaning liquid from a cleaning liquid supply part (for example, the nozzle 41d) so as to clean the substrate processing part 30 and the liquid drainage part 50. Thereby, in a processing recipe S1a before such a cleaning operation S3 is executed, it is possible to eliminate a crystal(s) that originate(s) from a BHF that is attached to the substrate processing part 30 and the liquid drainage part 50.

A return operation S4 is to supply, for example, a BHF that is used in a subsequent processing recipe S1b (that will also be referred to as a "BHF for a subsequent process" below) from a processing liquid supply part (for example, the nozzles 41a to 41c) so as to replace a DIW that is attached to the substrate processing part 30 and the liquid drainage part 50 with a BHF for a subsequent process.

That is, in an embodiment, a DIW that remains on the substrate processing part 30 or the liquid drainage part 50 after a cleaning operation S3 is preliminarily cleaned with a BHF for a subsequent process in a return operation S4. Thereby, it is possible to prevent or reduce recovering of a DIW that remains on the substrate processing part 30 or the liquid drainage part 50 after a cleaning operation S3, in the storage parts 70a to 70c.

Therefore, according to an embodiment, even if liquid processing is executed in a subsequent processing recipe S1b while a BHF for a subsequent process is recovered, it is possible to prevent or reduce a decrease of a concentration of a recovered BHF, so that it is possible to prevent or reduce degradation of a performance of liquid processing.

Furthermore, in an embodiment, it is preferable that the control unit 18 selects a cleaning recipe S2 based on a processing recipe S1. For example, it is preferable that the control unit 18 selects a cleaning recipe S2 based on a kind of a BHF that is used in a processing recipe S1.

Next, details of such a cleaning operation S3 and a return operation S4 will be explained with reference to FIG. 6A to FIG. 6G. FIG. 6A to FIG. 6G are diagrams (part 1 to part 7) that illustrate an operation example of a cleaning operation and a return operation according to an embodiment.

Figure 6A:
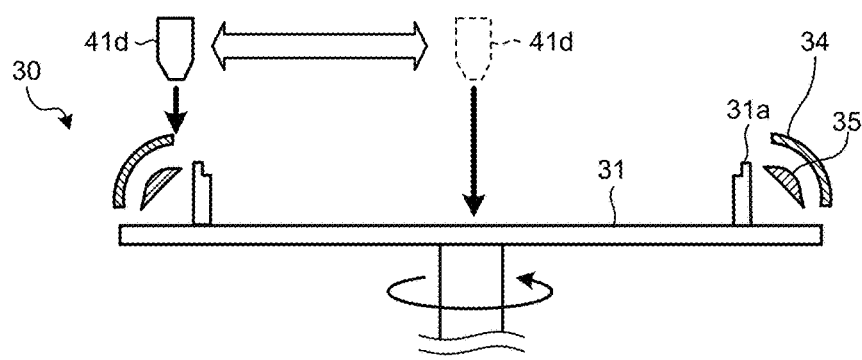
FIG. 6A is a diagram (part 1) that illustrates an operation example of a cleaning operation and a return operation according to an embodiment.

As illustrated in FIG. 6A, a cleaning operation S3 is, for example, a process to clean the rotation holding part 31, the holding member 31a, the first rotation cup 34, and the second rotation cup 35. In such a case, for example, in a state where the rotation holding part 31 is rotated, a DIW is supplied from the nozzle 41d while the nozzle 41d is reciprocated between a central part and an outer peripheral part of the rotation holding part 31.

Thereby, it is possible to eliminate a crystal(s) that is/are attached to the rotation holding part 31 and the holding member 31a, the first rotation cup 34, and the second rotation cup 35 that are arranged on an outer peripheral part of the rotation holding part 31.

Similarly, a return operation S4 is, for example, a process to preliminarily clean the rotation holding part 31, the holding member 31a, the first rotation cup 34, and the second rotation cup 35 with a BHF for a subsequent process. In such a case, for example, in a state where the rotation holding part 31 is rotated, while one of the nozzles 41a to 41c (see FIG. 2) is reciprocated between a central part and an outer peripheral part of the rotation holding part 31, a BHF for a subsequent process is supplied from such a nozzle.

Thereby, it is possible to replace a DIW that is attached to the rotation holding part 31 and the holding member 31a, the first rotation cup 34, and the second rotation cup 35 that are arranged on an outer peripheral part of the rotation holding part 31, with a BHF for a subsequent process.

Figure 6B:
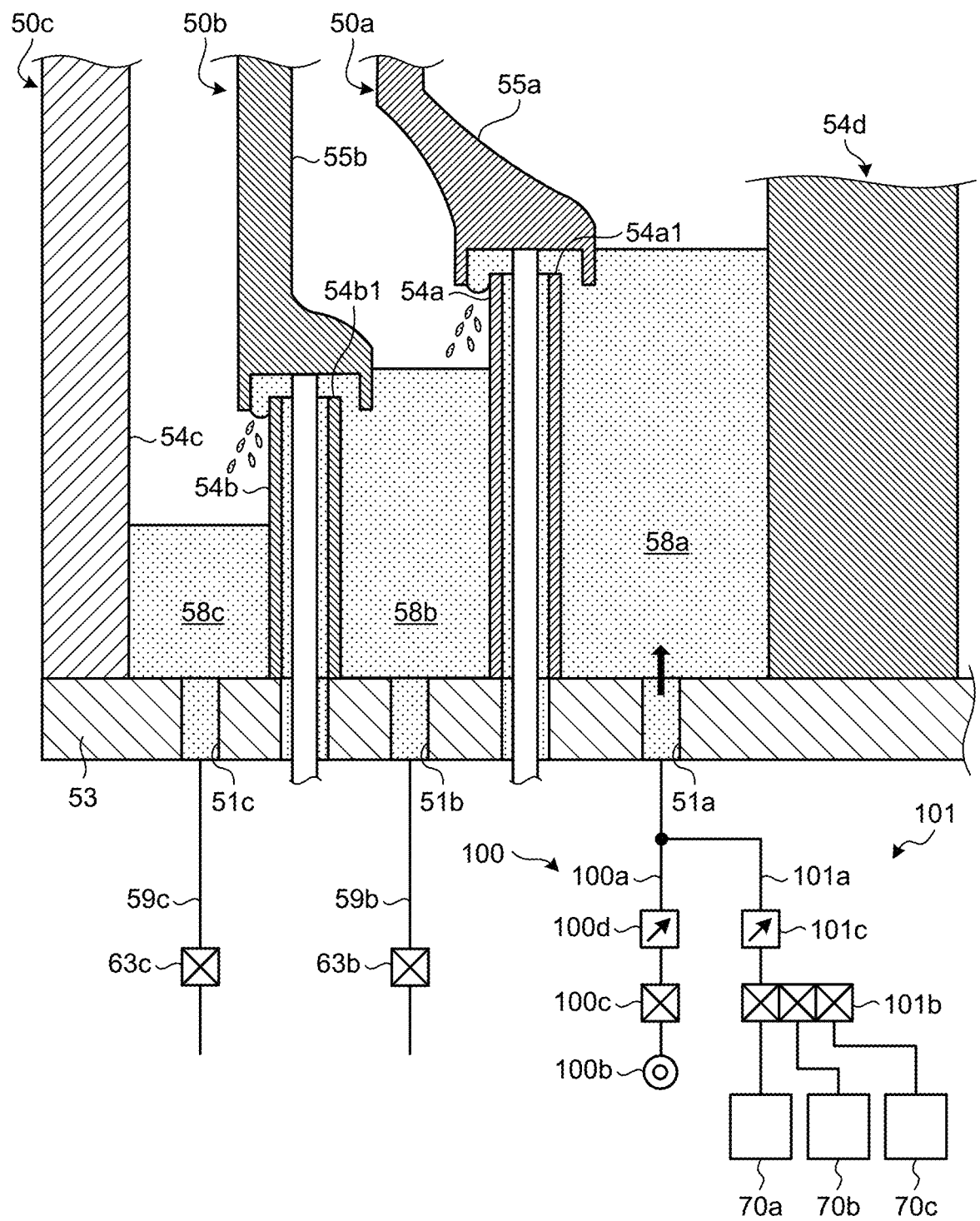
FIG. 6B is a diagram (part 2) that illustrates an operation example of a cleaning operation and a return operation according to an embodiment.

Furthermore, as illustrated in FIG. 6B, a cleaning operation S3 is, for example, a process to clean the first to third liquid drainage grooves 58a to 58c. In such a case, a processing unit 16 includes a cleaning liquid supply part 100 that supplies a DIW that is a cleaning liquid to the first liquid drainage groove 58a.

The cleaning liquid supply part 100 includes a cleaning liquid supply channel 100a, a DIW supply source 100b, a valve 100c, and a flow rate adjustor 100d. The cleaning liquid supply channel 100a is provided with one end that is connected to the DIW supply source 100b and another end that is connected to the liquid drainage port 51a of the first cup 50a. The valve 100c and the flow rate adjustor 100d are provided on the cleaning liquid supply channel 100a and controlled by the control device 4.

In a cleaning operation S3 as illustrated in FIG. 6B, the valve 100c is opened for a predetermined period of time, so that a DIW is supplied to the first liquid drainage groove 58a. Thereby, a DIW is stored in the first liquid drainage groove 58a and the DIW that is stored in the first liquid drainage groove 58a passes over the upper surface 54a1 of the first peripheral wall part 54a and overflows toward the second liquid drainage groove 58b, so that the DIW is stored in the second liquid drainage groove 58b.

Moreover, a DIW that is stored in the second liquid drainage groove 58b passes over the upper surface 54b1 of the second peripheral wall part 54b and overflows toward the third liquid drainage groove 58c, so that the DIW is also stored in the third liquid drainage groove 58c.

Subsequently, a DIW is discharged from the respective liquid drainage ports 51a to 51c. Thereby, it is possible to eliminate a crystal(s) that is/are attached to the first to third liquid drainage grooves 58a to 58c.

Similarly, a return operation S4 is, for example, a process to preliminarily clean the first to third liquid drainage grooves 58a to 58c with a BHF for a subsequent process. In such a case, a processing unit 16 includes a processing liquid supply part 101 that supplies a BHF for a subsequent process to the first liquid drainage groove 58a.

The processing liquid supply part 101 includes a processing liquid supply channel 101a, a switching valve 101b, and a flow rate adjustor 101c. The processing liquid supply channel 101a is provided with one end that is connected to each of the storage parts 70a to 70c through the switching valve 101b and another end that is connected to the liquid drainage port 51a of the first cup 50a. The switching valve 101b and the flow rate adjustor 101c are provided on the processing liquid supply channel 101a and controlled by the control device 4.

In a return operation S4 as illustrated in FIG. 6B, the switching valve 101b is controlled so as to connect one of the storage parts 70a to 70c where a BHF for a subsequent process is stored and the first liquid drainage groove 58a, so that the BHF for a subsequent process is supplied to the first liquid drainage groove 58a.

Thereby, a BHF for a subsequent process is stored in the first liquid drainage groove 58a and the BHF for a subsequent process that is stored in the first liquid drainage groove 58a passes over the upper surface 54a1 of the first peripheral wall part 54a and overflows toward the second liquid drainage groove 58b, so that the BHF for a subsequent process is stored in the second liquid drainage groove 58b.

Moreover, a BHF for a subsequent process that is stored in the second liquid drainage groove 58b passes over the upper surface 54b1 of the second peripheral wall part 54b and overflows toward the third liquid drainage groove 58c, so that the BHF for a subsequent process is also stored in the third liquid drainage groove 58c.

Subsequently, a BHF for a subsequent process is discharged from the respective liquid drainage ports 51a to 51c. Thereby, it is possible to replace a DIW that is attached to the first to third liquid drainage grooves 58a to 58c with a BHF for a subsequent process.

Figure 6C:
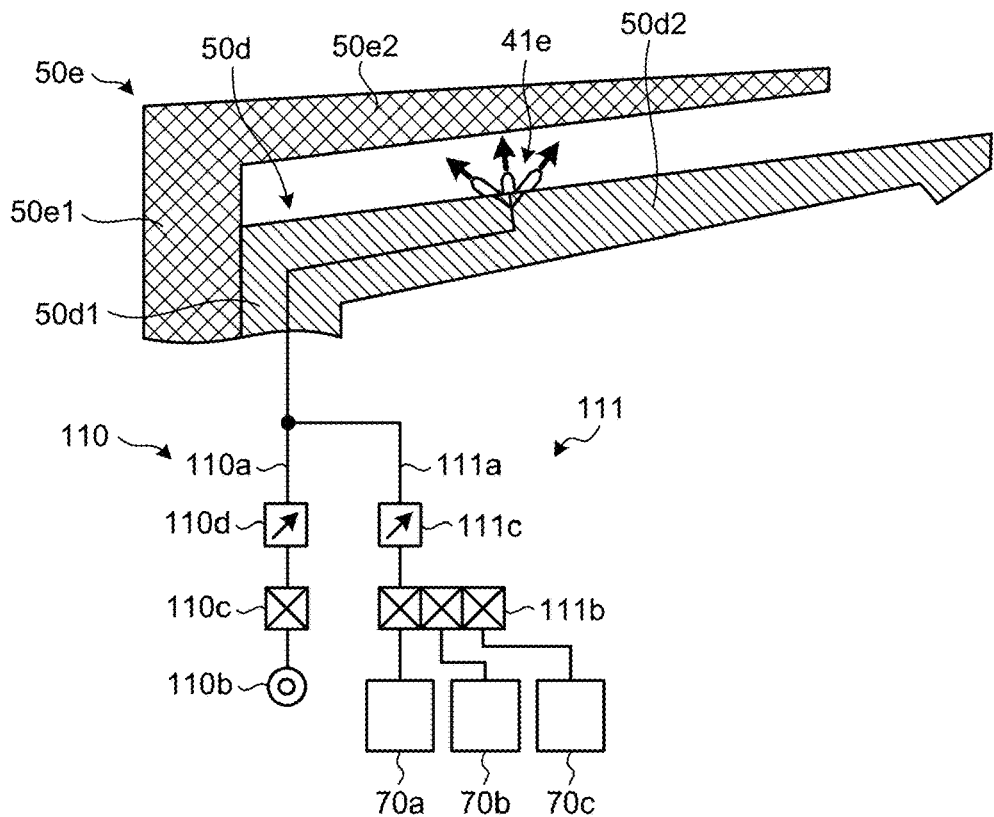
FIG. 6C is a diagram (part 3) that illustrates an operation example of a cleaning operation and a return operation according to an embodiment.

Furthermore, as illustrated in FIG. 6C, an exhaust cup 50d may be arranged between the third cup 50c (see FIG. 2) and the mist guard 50e inside the chamber 20. The exhaust cup 50d includes an outer peripheral cylindrical part 50d1 and an overhanging part 50d2 that overhangs an upper end part of the outer peripheral cylindrical part 50d1 to an inside of the outer peripheral cylindrical part 50d1 in a radial direction thereof. Additionally, the exhaust cup 50d is immobile.

In such a case, a cleaning operation S3 is, for example, a process to clean a lower surface of the overhanging part 50e2 of the mist guard 50e and an upper surface of the overhanging part 50d2 of the exhaust cup 50d. In such a case, a processing unit 16 includes, for example, a cleaning liquid supply part 110 that supplies a cleaning liquid to a lower surface of the overhanging part 50e2 of the mist guard 50e.

The cleaning liquid supply part 110 includes a cleaning liquid supply channel 110a, a DIW supply source 110b, a valve 110c, and a flow rate adjustor 110d. The cleaning liquid supply channel 110a is provided with one end that is connected to the DIW supply source 110b and another end that is connected to a nozzle 41e that is provided on an upper surface of the overhanging part 50d2 of the exhaust cup 50d. The valve 110c and the flow rate adjustor 110d are provided on the cleaning liquid supply channel 110a and controlled by the control device 4.

In a cleaning operation S3 as illustrated in FIG. 6C, a DIW is supplied from the nozzle 41e, so that the DIW is stored in a space between the overhanging part 50e2 of the mist guard 50e and the overhanging part 50d2 of the exhaust cup 50d. Subsequently, a DIW is discharged from a non-illustrated liquid drainage route. Thereby, it is possible to eliminate a crystal(s) that is/are attached to a lower surface of the overhanging part 50e2 of the mist guard 50e and an upper surface of the overhanging part 50d2 of the exhaust cup 50d.

Similarly, a return operation S4 is, for example, a process to preliminarily clean a lower surface of the overhanging part 50e2 of the mist guard 50e and an upper surface of the overhanging part 50d2 of the exhaust cup 50d with a BHF for a subsequent process. In such a case, a processing unit 16 includes a processing liquid supply part 111 that supplies a BHF for a subsequent process to the nozzle 41e.

The processing liquid supply part 111 includes a processing liquid supply channel 111a, a switching valve 111b, and a flow rate adjustor 111c. The processing liquid supply channel 111a is provided with one end that is connected to each of the storage parts 70a to 70c through the switching valve 111b and another end that is connected to the nozzle 41e. The switching valve 111b and the flow rate adjustor 111c are provided on the processing liquid supply channel 111a and controlled by the control device 4.

In a return operation S4 as illustrated in FIG. 6C, the switching valve 111b is controlled so as to connect one of the storage parts 70a to 70c where a BHF for a subsequent process is stored and the nozzle 41e, so that the BHF for a subsequent process is supplied to the nozzle 41e.

Thereby, a BHF for a subsequent process is stored in a space between the overhanging part 50e2 of the mist guard 50e and the overhanging part 50d2 of the exhaust cup 50d. Subsequently, a BHF for a subsequent process is discharged from a non-illustrated liquid drainage route. Thereby, it is possible to replace a DIW that is attached to a lower surface of the overhanging part 50e2 of the mist guard 50e and an upper surface of the overhanging part 50d2 of the exhaust cup 50d, with a BHF for a subsequent process.

Figure 6D:
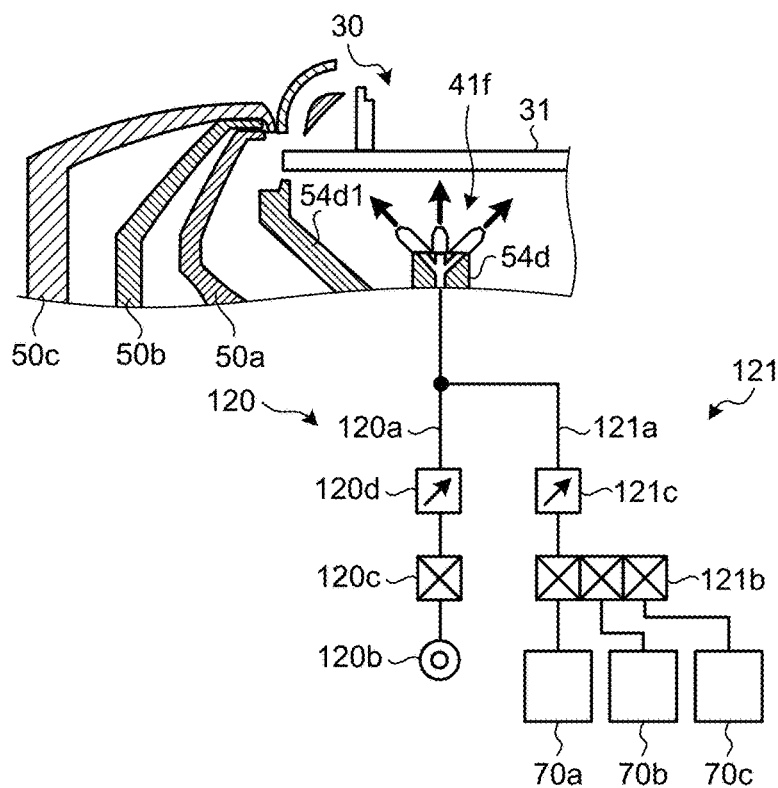
FIG. 6D is a diagram (part 4) that illustrates an operation example of a cleaning operation and a return operation according to an embodiment.

Furthermore, as illustrated in FIG. 6D, a cleaning operation S3 is, for example, a process to clean a lower surface of the rotation holding part 31 of the substrate processing part 30. In such a case, a processing unit 16 includes a cleaning liquid supply part 120 that supplies a cleaning liquid to a lower surface of the rotation holding part 31.

The cleaning liquid supply part 120 includes a nozzle 41f. The nozzle 41f is provided on, for example, an upper end part of the inner wall part 54d. Furthermore, the cleaning liquid supply part 120 includes a cleaning liquid supply channel 120a, a DIW supply source 120b, a valve 120c, and a flow rate adjustor 120d.

The cleaning liquid supply channel 120a is provided with one end that is connected to the DIW supply source 120b and another end that is connected to the nozzle 41f. The valve 120c and the flow rate adjustor 120d are provided on the cleaning liquid supply channel 120a and controlled by the control device 4.

In a cleaning operation S3 as illustrated in FIG. 6D, a DIW is supplied from the nozzle 41f to a lower surface of the rotating rotation holding part 31. Thereby, it is possible to eliminate a crystal(s) that is/are attached to a lower surface of the rotation holding part 31.

Similarly, a return operation S4 is, for example, a process to preliminarily clean a lower surface of the rotation holding part 31 of the substrate processing part 30 with a BHF for a subsequent process. In such a case, a processing unit 16 includes a processing liquid supply part 121 that supplies a BHF for a subsequent process to the nozzle 41f.

The processing liquid supply part 121 includes a processing liquid supply channel 121a, a switching valve 121b, and a flow rate adjustor 121c. The processing liquid supply channel 121a is provided with one end that is connected to each of the storage parts 70a to 70c through the switching valve 121b and another end that is connected to the nozzle 41f. The switching valve 121b and the flow rate adjustor 121c are provided on the processing liquid supply channel 121a and controlled by the control device 4.

In a return operation S4 as illustrated in FIG. 6D, the switching valve 121b is controlled so as to connect one of the storage parts 70a to 70c where a BHF for a subsequent process is stored and the nozzle 41f, so that the BHF for a subsequent process is supplied to the nozzle 41f. Then, a BHF for a subsequent process is supplied from the nozzle 41f to a lower surface of the rotating rotation holding part 31, so that it is possible to replace a DIW that is attached to a lower surface of the rotation holding part 31 with the BHF for a subsequent process.

Figure 6E:
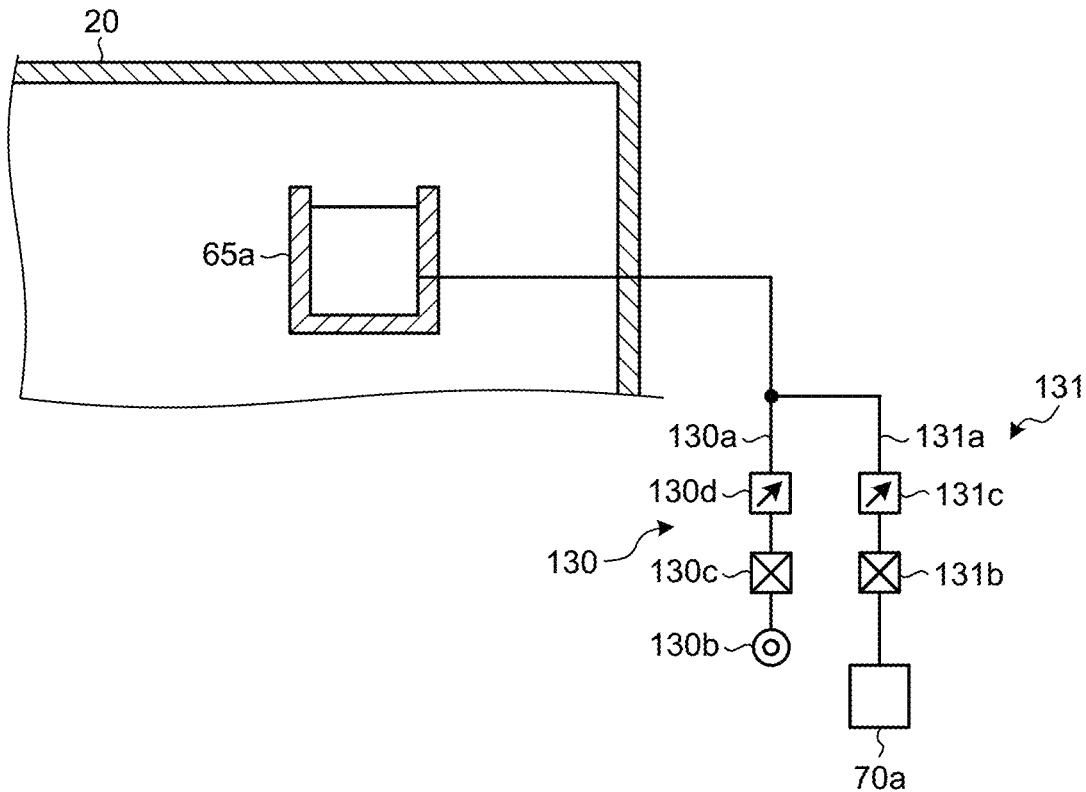
FIG. 6E is a diagram (part 5) that illustrates an operation example of a cleaning operation and a return operation according to an embodiment.

Furthermore, as illustrated in FIG. 6E, a cleaning operation S3 is, for example, a process to clean waiting parts 65a to 65c that are provided in the chamber 20. In such a case, a processing unit 16 includes a cleaning liquid supply part 130 that supplies a cleaning liquid to the waiting parts 65a to 65c. Additionally, hereinafter, each operation for the waiting part 65a as illustrated in FIG. 6E will be explained to facilitate understanding thereof.

The cleaning liquid supply part 130 includes a cleaning liquid supply channel 130a, a DIW supply source 130b, a valve 130c, and a flow rate adjustor 130d. The cleaning liquid supply channel 130a is provided with one end that is connected to the DIW supply source 130b and another end that is connected to the waiting part 65a. The valve 130c and the flow rate adjustor 130d are provided on the cleaning liquid supply channel 130a and controlled by the control device 4.

In a cleaning operation S3 as illustrated in FIG. 6E, a DIW is stored in the waiting part 65a for a predetermined period of time and subsequently the DIW is discharged from the waiting part 65a to the liquid drainage channel 59a (see FIG. 3). Thereby, it is possible to eliminate a crystal(s) that is/are attached to the waiting part 65a.

Similarly, a return operation S4 is, for example, a process to preliminarily clean the waiting part 65a that is provided in the chamber 20 with a BHF for a subsequent process. In such a case, a processing unit 16 includes a processing liquid supply part 131 that supplies a BHF for a subsequent process to the waiting part 65a.

The processing liquid supply part 131 includes a processing liquid supply channel 131a, a valve 131b, and a flow rate adjustor 131c. The processing liquid supply channel 131a is provided with one end that is connected to the corresponding storage part 70a through the valve 131b and another end that is connected to the waiting part 65a. The valve 131b and the flow rate adjustor 131c are provided on the processing liquid supply channel 131a and controlled by the control device 4.

In a return operation S4 as illustrated in FIG. 6E, the valve 131b is controlled so as to connect the storage part 70a where a BHF for a subsequent process is stored and the waiting part 65a, so that the BHF for a subsequent process is supplied to the waiting part 65a.

Then, a BHF for a subsequent process is stored in the waiting part 65a for a predetermined period of time and subsequently the BHF for a subsequent process is discharged from the waiting part 65a to the liquid discharge channel 59a. Thereby, it is possible to replace a DIW that is attached to the waiting part 65a with a BHF for a subsequent process.

Figure 6F:
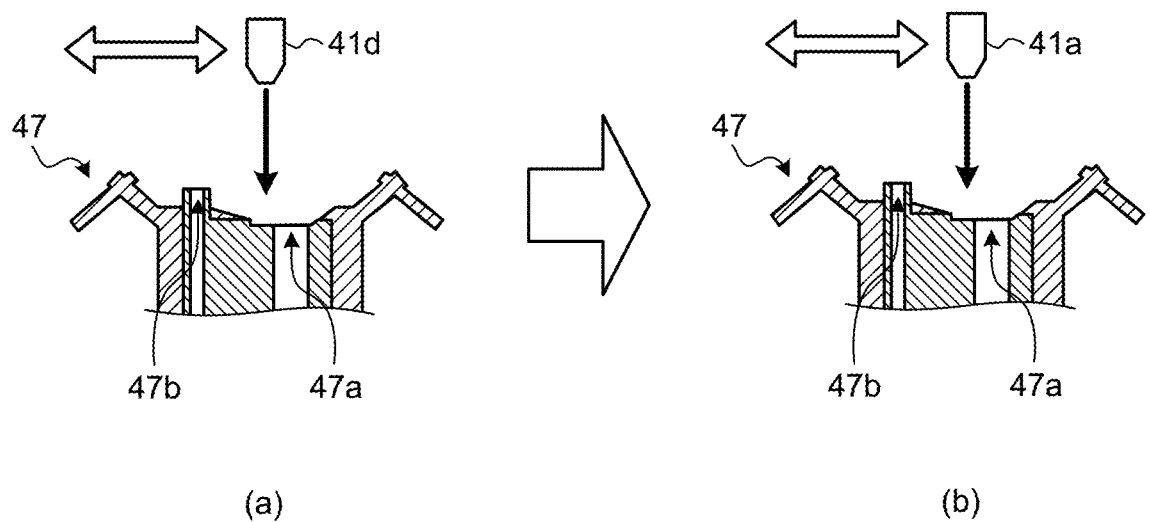
FIG. 6F is a diagram (part 6) that illustrates an operation example of a cleaning operation and a return operation according to an embodiment.

Furthermore, as illustrated in FIG. 6F, a back surface nozzle 47 that discharges a processing liquid or the like to a back surface of a wafer W may be arranged inside the chamber 20. The back surface nozzle 47 is an example of a back surface supply part. The back surface nozzle 47 is provided so as to face a back surface of a wafer W that is held by the holding member 31a and discharges a processing liquid or the like in an upward direction.

The back surface nozzle 47 has a processing liquid discharge port 47a that discharges first to third BHFS that are processing liquids, and a cleaning liquid discharge port 47*b* that discharges a DIW that is a cleaning liquid. Such a back surface nozzle 47 is provided on a processing unit 16, so that it is possible to liquid-process not only a front surface of a wafer W but also a back surface of the wafer W by a BHF.

In a cleaning operation S3 as illustrated in (a) of FIG. 6F, for example, in a state where a wafer W is not held by the holding member 31*a*, a DIW is supplied from the nozzle 41*d* while the nozzle 41*d* is reciprocated between a central part and an outer peripheral part of the back surface nozzle 47. Thereby, it is possible to eliminate a crystal(s) that is/are attached to the back surface nozzle 47.

Similarly, a return operation S4 as illustrated in (b) of FIG. 6F is, for example, a process to preliminarily clean the back surface nozzle 47 with a BHF for a subsequent process. In such a case, for example, in a state where a wafer W is not held by the holding member 31*a*, while one of the nozzles 41*a* to 41*c* (the nozzle 41*a* in the figure) is reciprocated between a central part and an outer peripheral part of the back surface nozzle 47, a BHF for a subsequent process is supplied from such a nozzle. Thereby, it is possible to replace a DIW that is attached to the back surface nozzle 47 with a BHF for a subsequent process.

Additionally, a cleaning operation S3 and a return operation S4 for the back surface nozzle 47 are not limited to examples as illustrated in FIG. 6F. For example, as illustrated in (a) of FIG. 6G, a cleaning operation S3 for the back surface nozzle 47 may be executed by discharging a DIW that is a cleaning liquid from the cleaning liquid discharge port 47*b* and overflowing such a DIW on the back surface nozzle 47. Thereby, it is possible to eliminate a crystal(s) that is/are attached to the back surface nozzle 47.

Figure 6G:
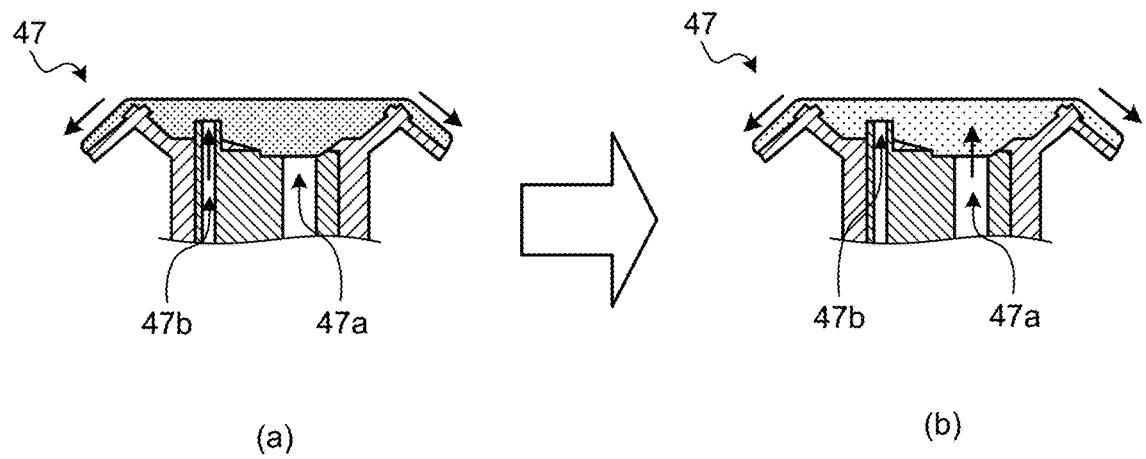
FIG. 6G is a diagram (part 7) that illustrates an operation example of a cleaning operation and a return operation according to an embodiment.

Then, as illustrated in (b) of FIG. 6G, a return operation S4 for the back surface nozzle 47 may be executed by discharging a BHF for a subsequent process from the processing liquid discharge port 47*a* and overflowing such a BHF for a subsequent process on the back surface nozzle 47. Thereby, it is possible to replace a DIW that is attached to the back surface nozzle 47 with a BHF for a subsequent process.

Furthermore, a cleaning recipe S2 may be executed where a set of a cleaning operation S3 and a return operation S4 as illustrated in FIG. 6F and a set of a cleaning operation S3 and a return operation S4 as illustrated in FIG. 6G are combined. For example, after a DIW is supplied from the nozzle 41*d* so as to execute a cleaning operation S3, a BHF for a subsequent process may be discharged from the cleaning liquid discharge port 47*a* of the back surface nozzle 47 so as to execute a return operation S4.

Similarly, after a DIW is discharged from the cleaning liquid discharge port 47*b* of the back surface nozzle 47 so as to execute a cleaning operation S3, a BHF for a subsequent process may be supplied from one of the nozzles 41*a* to 41*c* so as to execute a return operation S4.

Additionally, in a cleaning operation S3 and a return operation S4 in each part as thus far explained, it is preferable that the control unit 18 controls the switching valves 63*a* to 63*c* (see FIG. 3) so as to discharge a liquid drainage that flows through the liquid drainage channels 59*a* to 59*c* from the drain part DR to an outside thereof.

Figure 7:
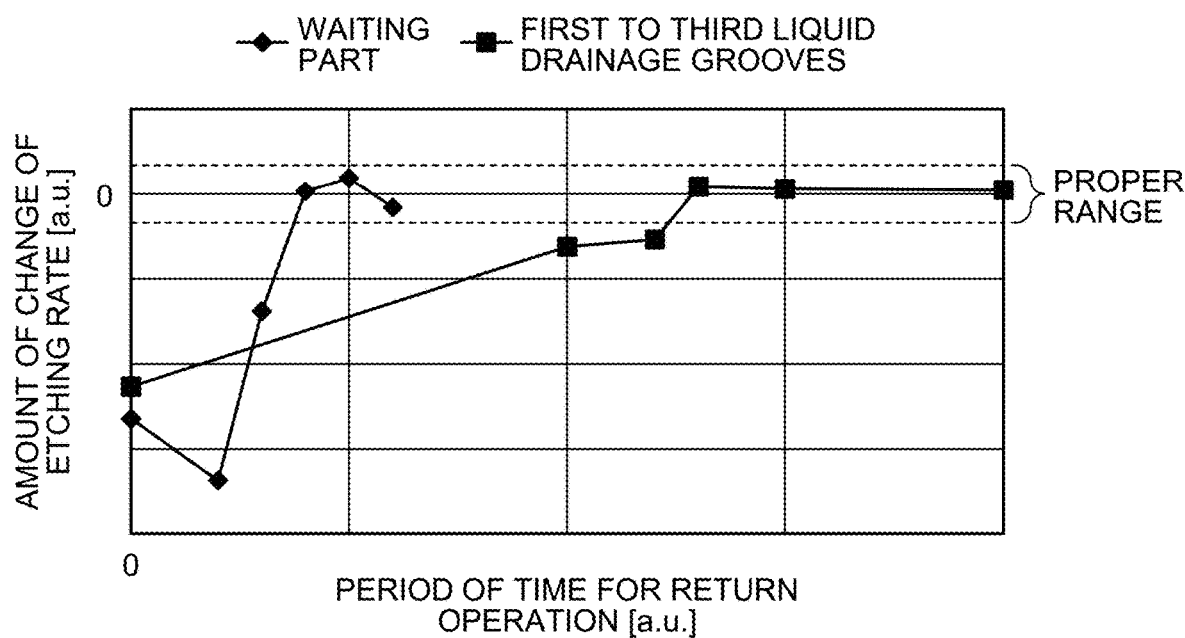
FIG. 7 is a diagram that illustrates a relationship between a period of time for a return operation and an amount of change of an etching rate in a subsequent processing recipe, according to an embodiment.

FIG. 7 is a diagram that illustrates a relationship between a period of time for a return operation S4 according to an embodiment and an amount of change of an etching rate in a subsequent processing recipe S1*b*. Additionally, FIG. 7 illustrates each of a return operation S4 for the waiting parts 65*a* to 65*c* (see FIG. 6E) and a return operation S4 for the first to third liquid drainage grooves 58*a* to 58*c* (see FIG. 6B).

As illustrated in FIG. 7, in a case where a period of time for a return operation S4 is comparatively short, it is found that an etching rate is greatly decreased in a subsequent processing recipe S1. This is because, in a case where a period of time for a return operation S4 is comparatively short, a comparatively large amount of a DIW that is used in a cleaning operation S3 remains on the substrate processing part 30 or the liquid drainage part 50 so that such a DIW is incorporated into a BHF that is recovered in a subsequent processing recipe S1*b* and a concentration of a BHF to be reused is decreased.

On the other hand, as illustrated in FIG. 7, a period of time for a return operation S4 is increased, so that it is possible to maintain an etching rate in a subsequent processing recipe S1 within a proper range.

That is, a liquid drainage that flows through the liquid drainage channels 59*a* to 59*c* is discharged from the drain part DR to an outside thereof in a cleaning operation S3 and a return operation S4, so that it is possible to prevent or reduce recovering of a DIW that is a cleaning liquid or a BHF that includes such a DIW in the storage parts 70*a* to 70*c*.

Furthermore, in an embodiment, a return operation S4 for a period of time that corresponds to a BHF for a subsequent process is executed, so that it is possible to maintain an etching rate in a subsequent processing recipe S1*b* within a proper range even if a reused BHF is used.

As thus far explained, according to an embodiment, it is possible to prevent or reduce a decrease of a concentration of a recovered BHF, so that it is possible to prevent or reduce degrading of a performance of liquid processing.

Additionally, it is preferable that, depending on a kind of BHF that is included in a processing recipe S1*b* for a subsequent process, a "return operation S4 for a period of time that corresponds to a BHF for a subsequent process" as described above is preliminarily included in a cleaning recipe S2 that corresponds to such a kind of BHF. That is, in an embodiment, it is preferable that a cleaning recipe S2 is selected based on a processing recipe S1*b* for a subsequent process of such a cleaning recipe S2.

For example, in a case where a first BHF is used in a processing recipe S1*b* for a subsequent process, it is preferable that the control unit 18 reads, from the storage unit 19, a cleaning recipe S2 where such a first BHF is used in a return operation S4. In such a read cleaning recipe S2, an execution time of a return operation S4 that corresponds to a first BHF is included.

Thus, a cleaning recipe S2 is selected based on a processing recipe S1*b* for a subsequent process, so that it is possible to start liquid processing for a subsequent process in a state where replacement with a BHF that is used in the processing recipe S1*b* for a subsequent process is executed for the substrate processing part 30 or the like. Therefore, according to an embodiment, in a case where a BHF that is used in a processing recipe S1*b* is recovered and used again, it is possible to prevent or reduce changing of a concentration of such a BHF, so that it is possible to execute liquid processing for a subsequent process stably.

Furthermore, in an embodiment, when a BHF for a subsequent process is discharged from one of the nozzles 41*a* to 41*c* for preliminary cleaning in a return process S4, liquid processing for a wafer W may be executed by using such a BHF for a subsequent process to be discharged.

Thereby, it is possible to execute liquid processing for a wafer W during a return process S4, so that it is possible to return a processing unit 16 to liquid processing promptly.

Various Types of Variations

Figure 8:
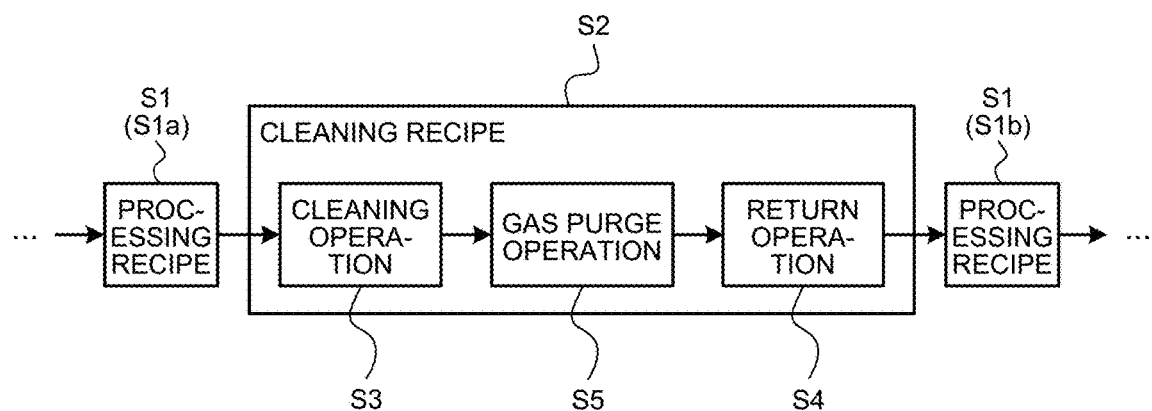
FIG. 8 is a diagram for explaining a flow of a process in a substrate processing system according to variation 1 of an embodiment.

Next, various types of variations of an embodiment will be explained with reference to FIG. 8 and FIG. 9. FIG. 8 is a diagram for explaining a flow of a process in a substrate processing system 1 according to variation 1 of an embodiment.

As illustrated in FIG. 8, a cleaning recipe S2 according to variation 1 is different from that of an embodiment in that a gas purge operation S5 is executed between a cleaning operation S3 and a return operation S4. In such variation 1, a processing unit 16 has a (non-illustrated) gas supply part that executes purging with a gas for the substrate processing part 30 and the liquid drainage part 50.

Then, in variation 1, after the control unit 18 (see FIG. 1) executes a cleaning operation S3, a gas is supplied from such a gas supply part so as to execute a gas purge operation S5 for purging a DIW that is attached to the substrate processing part 30 and the liquid drainage part 50.

Thereby, it is possible to decrease a DIW that is attached to the substrate processing part 30 and the liquid drainage part 50 before a return operation S4. Therefore, according to an embodiment, it is possible to decrease a period of time that is needed for a return operation S4, so that it is possible to return a processing unit 16 to liquid processing promptly.

In such a gas purge operation S5, it is preferable that the control unit 18 supplies a gas to a site where a DIW is retained. In particular, a DIW penetrates into a narrow gap on a movable part (for example, the first or second liquid receiving parts 55a, 55b, the first or second support members 56a, 57a, or the like) in a processing unit 16 and replacement is not readily attained even if preliminary cleaning is executed, so that it is preferable that a gas purge operation S5 is executed near such a movable part.

Thereby, it is possible to further decrease a DIW that is attached to the substrate processing part 30 and the liquid drainage part 50 before a return operation S4.

Figure 9:
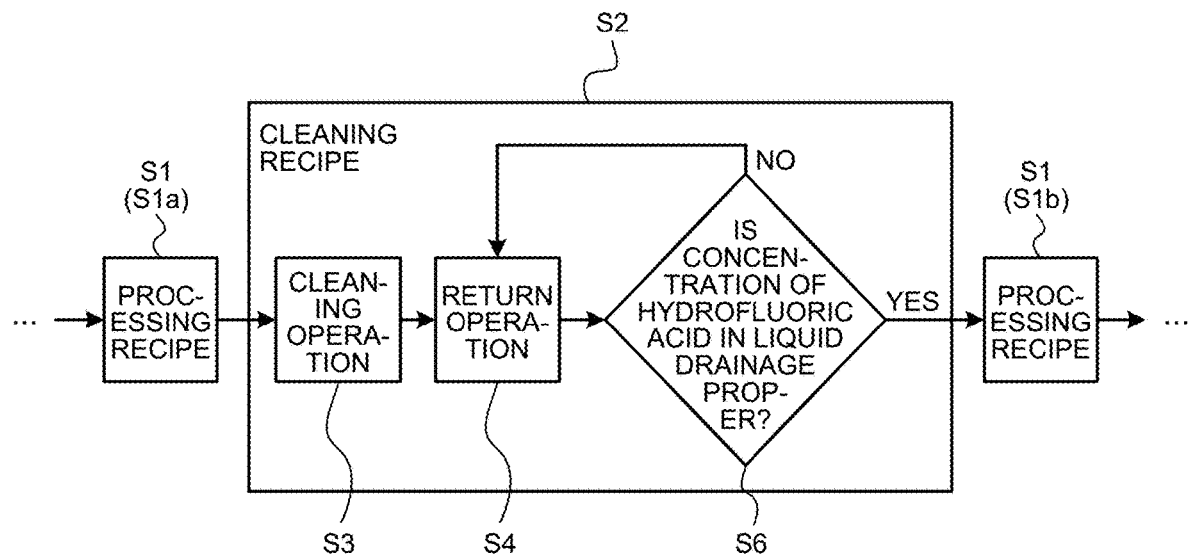
FIG. 9 is a diagram for explaining a flow of a process in a substrate processing system according to variation 2 of an embodiment.

FIG. 9 is a diagram for explaining a flow of a process in a substrate processing system 1 according to variation 2 of an embodiment. In a cleaning recipe S2 according to variation 2, a concentration of hydrofluoric acid in a liquid drainage that flows through the liquid drainage channels 59a to 59c (see FIG. 3) is detected by the concentration sensors 62a to 62c (see FIG. 3) at a time of a return operation S4.

Then, the control unit 18 executes a determination operation S6 for determining whether or not a concentration of hydrofluoric acid in a liquid drainage that flows through the liquid drainage channels 59a to 59c is proper.

Herein, in a case where a DIW in the substrate processing part 30 and the liquid drainage part 50 is replaced with a BHF for a subsequent process by a return operation S4 and a concentration of hydrofluoric acid in a liquid drainage is proper, the control unit 18 ends the return operation S4 and starts a subsequent processing recipe S1b.

Herein, the control unit 18 controls the switching valves 63a to 63c (see FIG. 3) so as to switch a discharge route for a liquid drainage that flows through the liquid drainage channels 59a to 59c to the recovery channels 64a to 64c (see FIG. 3). Thereby, it is possible to execute a processing recipe S1b while a BHF for a subsequent process is recovered.

On the other hand, in a case where a DIW in the substrate processing part 30 and the liquid drainage part 50 is not sufficiently replaced and a concentration of hydrofluoric acid in a liquid drainage is not proper, the control unit 18 continues a return operation S4.

Additionally, herein, the control unit 18 controls the switching valves 63a to 63c so as to maintain a discharge route for a liquid drainage that flows through the liquid drainage channels 59a to 59c at the drain part DR. Thereby, it is possible to further prevent or reduce recovering of a BHF that is mixed with a DIW.

That is, in variation 2 as illustrated in FIG. 9, a return operation S4 is executed while a concentration of hydrofluoric acid in a liquid drainage that flows through the liquid drainages channels 59a to 59c is detected by the concentration sensors 62a to 62c, so that it is possible to further prevent or reduce recovering of a BHF that is mixed with a DIW.

In such variation 2, for example, it is preferable to execute application to a case where a BHF with a high concentration of hydrofluoric acid, among BHFS that have various types of concentrations of hydrofluoric acid, is a BHF for a subsequent process. An etching rate of such a BHF with a high concentration of hydrofluoric acid is greatly changed even in a case where a trace of DIW is mixed therewith. That is, a sensitivity of a BHF with a high concentration of hydrofluoric acid to a DIW is higher than that of a BHF with a low concentration of hydrofluoric acid.

Thus, a determination operation S6 as described above is applied to a BHF with a high sensitivity to a DIW, so that it is possible to prevent a DIW from being mixed into a recovered liquid of such a BHF, and hence, it is possible to execute liquid processing that uses a recovered liquid, stably.

Moreover, in a case where a BHF with a high concentration of hydrofluoric acid is a BHF for a subsequent process, it is preferable to execute application of a gas purge operation S5 in variation 1 in addition to a determination operation S6 in variation 2. Thereby, it is possible to decrease an amount of a DIW that is capable of being mixed into a BHF, per se, by a gas purge operation S5, so that it is possible to execute liquid processing that uses a recovered liquid, more stably.

A substrate processing apparatus (a substrate processing system 1) according to an embodiment includes a substrate processing part 30, a liquid drainage part 50, and a control unit 18. The substrate processing part 30 supplies a processing liquid from a processing liquid supply part to a substrate (a wafer W) that is mounted thereon to execute liquid processing thereof. The liquid drainage part 50 has a recovery channel 64a to 64c that is connected to a storage part 70a to 70c that stores the processing liquid and drains the processing liquid that is used for the liquid processing. The control unit 18 executes a processing recipe S1 for the liquid processing and a cleaning recipe S2 for cleaning the substrate processing part 30 and the liquid drainage part 50. Furthermore, the control unit 18 executes a cleaning operation S3 for supplying a cleaning liquid from a cleaning liquid supply part to clean the substrate processing part 30 and the liquid drainage part 50 as the cleaning recipe S2 and subsequently executes a return operation S4 for supplying the processing liquid from the processing liquid supply part to replace the cleaning liquid that is attached to the substrate processing part 30 and the liquid drainage part 50 with the processing liquid. Thereby, it is possible to prevent or reduce degrading of a performance of liquid processing.

Furthermore, in the substrate processing apparatus (the substrate processing system 1) according to an embodiment, the processing recipe S1 includes a sequence of processing for the substrate (the wafer W) and a kind of the processing liquid. Thereby, it is possible to execute liquid processing that is optimized for each of different kinds of processing liquids, by a processing unit 16.

Furthermore, in the substrate processing apparatus (the substrate processing system 1) according to an embodiment, the cleaning recipe S2 is selected based on a kind of the processing liquid that is included in the processing recipe S1. Thereby, it is possible to execute liquid processing for a subsequent process stably.

Furthermore, in the substrate processing apparatus (the substrate processing system 1) according to an embodiment, the cleaning recipe S2 is selected based on the processing recipe for a subsequent process S1b for such a cleaning recipe S2. Thereby, it is possible to execute liquid processing for a subsequent process stably.

Furthermore, in the substrate processing apparatus (the substrate processing system 1) according to an embodiment, the liquid drainage part 50 has a drain part DR that discharges the processing liquid to an outside. Then, the control unit 18 discharges a liquid drainage that flows through the liquid drainage part 59a to 59c, from the drain part DR to an outside, while the cleaning recipe S2 is executed. Thereby, it is possible to prevent or reduce recovering of a BHF that is mixed with a DIW.

Furthermore, in the substrate processing apparatus (the substrate processing system 1) according to an embodiment, the liquid drainage part 50 has a concentration sensor 62a to 62c that detects a concentration of the processing liquid. Then, the control unit 18 ends the return operation S4 based on a concentration of the processing liquid that is detected by the concentration sensor 62a to 62c. Thereby, it is possible to further prevent or reduce recovering of a BHF that is mixed with a DIW.

Furthermore, the substrate processing apparatus (the substrate processing system 1) according to an embodiment includes a gas supply part that supplies a gas to the substrate processing part 30 and the liquid drainage part. Then, the control unit 18 executes a gas purge operation S5 for supplying the gas to purge the cleaning liquid that is attached to the substrate processing part 30 and the liquid drainage part 50, after the cleaning operation S3 is executed. Thereby, it is possible to return a processing unit 16 to liquid processing promptly.

Furthermore, in the substrate processing apparatus (the substrate processing system 1) according to an embodiment, the control unit 18 supplies the gas to a site where the cleaning liquid is retained, as the gas purge operation S5. Thereby, it is possible to further decrease a cleaning liquid that is attached to the substrate processing part 30 and the liquid drainage part 50 before a return operation S4.

Furthermore, the substrate processing apparatus (the substrate processing system 1) according to an embodiment includes a waiting part 65a to 65c where the processing liquid supply part waits, where a liquid drainage channel of the waiting part 65a to 65c is connected to a liquid drainage channel 59a to 59c of the liquid drainage part 50. Then, the control unit 18 executes, for the waiting part 65a to 65c, the cleaning recipe S2 that is similar to that of the substrate processing part 30. Thereby, it is possible to prevent or reduce recovering of a BHF that is mixed with a DIW that is attached to the waiting part 65a to 65c.

Furthermore, the substrate processing apparatus (the substrate processing system 1) according to an embodiment includes a back surface supply part (a back surface nozzle 47) that discharges the processing liquid to a back surface side of the substrate (the wafer W). Then, the control unit 18 executes the cleaning recipe S2 for the back surface supply part (the back surface nozzle 47). Thereby, it is possible to prevent or reduce recovering of a BHF that is mixed with a DIW that is attached to the back surface nozzle 47.

Steps of Substrate Processing

Figure 10:
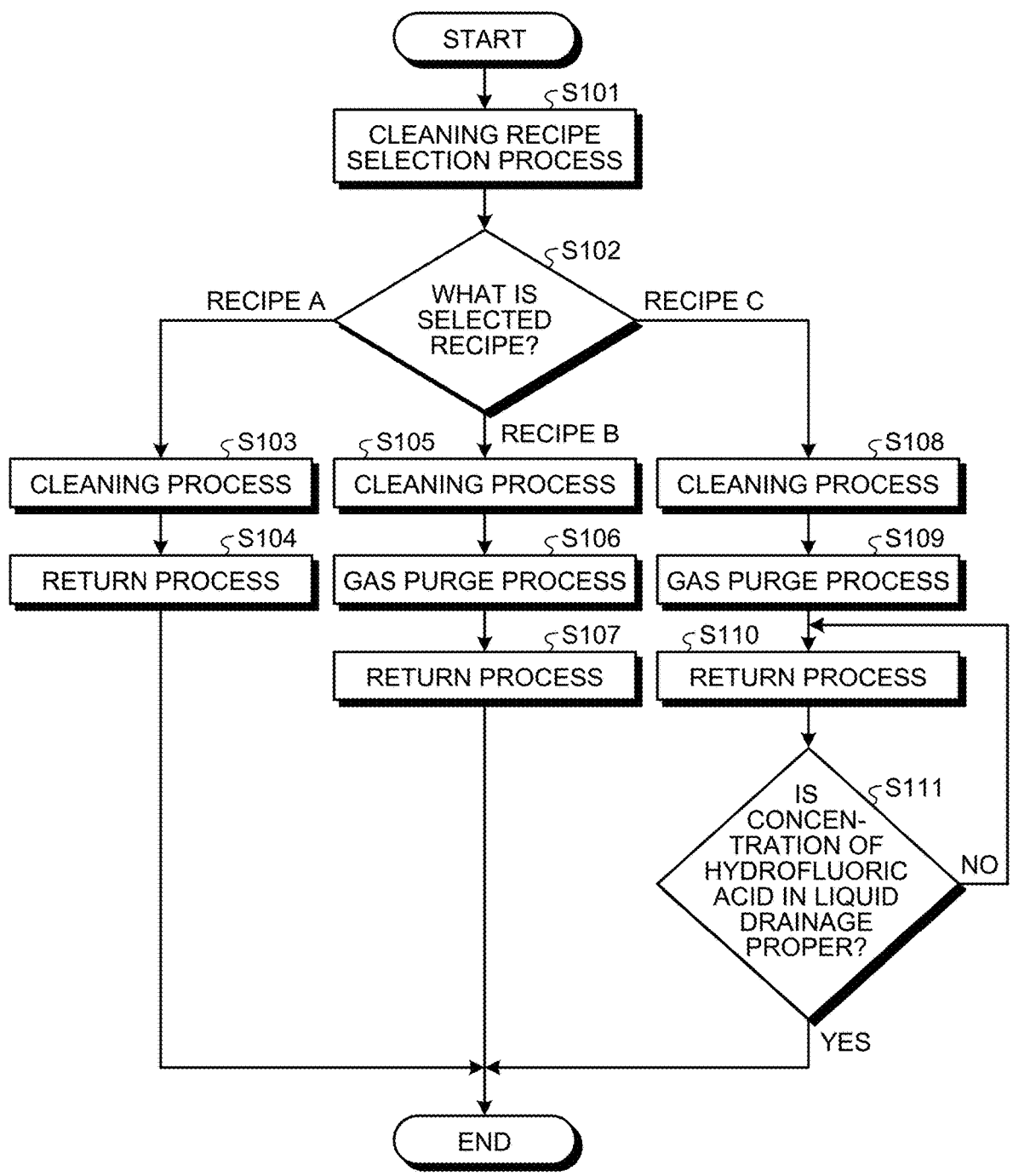
FIG. 10 is a flowchart that illustrates steps of substrate processing that is executed by a substrate processing system according to an embodiment.

Next, steps of substrate processing according to an embodiment will be explained with reference to FIG. 10. FIG. 10 is a flowchart that illustrates steps of substrate processing that is executed by the substrate processing system 1 according to an embodiment.

First, the control unit 18 executes a cleaning recipe selection process for selecting a cleaning recipe S2 based on a processing recipe S1b that is scheduled to execute subsequently (step S101). For example, the control unit 18 selects a cleaning recipe S2 that includes a BHF with a kind that is identical to that of a BHF for a subsequent process that is included in a processing recipe Sib that is scheduled to execute subsequently.

Herein, in a case where a selected cleaning recipe S2 is recipe A (step S102, recipe A), the control unit 18 executes a cleaning process based on selected recipe A (step S103). Such recipe A is, for example, a cleaning recipe S2 in a case where a BHF for a subsequent process is a first BHF.

Furthermore, such step S103 is a process to supply a DIW that is a cleaning liquid from a cleaning liquid supply part (for example, the nozzle 41d) and clean the substrate processing part 30 and the liquid drainage part 50 with such a DIW. In such step S103, it is possible to eliminate a crystal(s) that originate(s) from a BHF that is attached to the substrate processing part 30 and the liquid drainage part 50.

Then, the control unit 18 executes a return process to supply a BHF for a subsequent process from a processing liquid supply part and replace a DIW that is attached to the substrate processing part 30 and the liquid drainage part 50 with such a BHF, based on selected recipe A (step S104). Thereby, it is possible to prevent or reduce recovering of a DIW that remains on the substrate processing part 30 or the liquid drainage part 50, in the storage parts 70a to 70c.

Then, as a process at step S104 is executed for a period of time that is preliminarily determined in recipe A and such a process is ended, the control unit 18 ends a series of processes.

On the other hand, in a case where a cleaning recipe S2 that is selected at step S101 is recipe B (step S102, recipe B), the control unit 18 executes a cleaning process based on selected recipe B (step S105). Such recipe B is, for example, a cleaning recipe S2 in a case where a BHF for a subsequent process is a second BHF.

Furthermore, such step S105 is a process to supply a DIW that is a cleaning liquid from a cleaning liquid supply part (for example, the nozzle 41d) and clean the substrate processing part 30 and the liquid drainage part 50 with such a DIW. By such step S105, it is possible to eliminate a crystal(s) that originate(s) from a BHF that is attached to the substrate processing part 30 and the liquid drainage part 50.

Then, the control unit 18 executes a gas purge process to supply a gas from a gas supply part that is provided in a processing unit 16 and purge a DIW that is attached to the substrate processing part 30 and the liquid drainage part 50, based on selected recipe B (step S106). Thereby, it is possible to decrease a DIW that is attached to the substrate processing part 30 and the liquid drainage part 50 before a return process that is executed subsequently.

Then, the control unit 18 executes a return process to supply a BHF for a subsequent process from a processing liquid supply part and replace a DIW that is attached to the substrate processing part 30 and the liquid drainage part 50 with such a BHF, based on selected recipe B (step S107). Thereby, it is possible to prevent or reduce recovering of a DIW that remains on the substrate processing part 30 or the liquid drainage part 50, in the storage parts 70a to 70c.

Then, as a process at step S107 is executed for a period of time that is preliminarily determined in recipe B and such a process is ended, the control unit 18 ends a series of processes.

Furthermore, in a case where a cleaning recipe S2 that is selected at step S101 is recipe C (step S102, recipe C), the control unit 18 executes a cleaning process based on selected recipe C (step S108). Such recipe C is, for example, a cleaning recipe S2 in a case where a BHF for a subsequent process is a third BHF.

Furthermore, such step S108 is a process to supply a DIW that is a cleaning liquid from a cleaning liquid supply part (for example, the nozzle 41d) and clean the substrate processing part 30 and the liquid drainage part 50 with such a DIW. By such step S108, it is possible to eliminate a crystal(s) that originate(s) from a BHF that is attached to the substrate processing part 30 and the liquid drainage part 50.

Then, the control unit 18 executes a gas purge process to supply a gas from a gas supply part that is provided in a processing unit 16 and purge a DIW that is attached to the substrate processing part 30 and the liquid drainage part 50, based on selected recipe C (step S109). Thereby, it is possible to decrease a DIW that is attached to the substrate processing part 30 and the liquid drainage part 50, before a return process that is executed subsequently.

Then, the control unit 18 executes a return process to supply a BHF for a subsequent process from a processing liquid supply part and replace a DIW that is attached to the substrate processing part 30 and the liquid drainage part 50 with such a BHF, based on selected recipe C (step S110). Thereby, it is possible to prevent or reduce recovering of a DIW that remains on the substrate processing part 30 or the liquid drainage part 50, in the storage parts 70a to 70c.

Then, the control unit 18 determines whether or not a concentration of hydrofluoric acid in a liquid drainage that flows through the liquid drainage channels 59a to 59c is proper (step S111).

Then, in a case where a concentration of hydrofluoric acid in a liquid drainage is proper (step S111, Yes), the control unit 18 ends a series of processes. On the other hand, in a case where a concentration of hydrofluoric acid in a liquid drainage is not proper (step S111, No), the control unit 18 continues a process at step S110.

As thus far explained, in a substrate processing method according to an embodiment, a cleaning recipe S2 (recipe A to recipe C) is selected depending on a processing recipe S1b, so that it is possible to execute a optimal cleaning process that is dependent on a kind of a BHF that is used in the processing recipe S1b.

A substrate processing method according to an embodiment includes a liquid processing step and a cleaning step. The liquid processing step is to supply a processing liquid from a processing liquid supply part (nozzles 41a to 41c) to a substrate (a wafer W) that is mounted on a substrate processing part 30 and execute a processing recipe S1 for recovering the processing liquid that is used, from a liquid drainage part 50 to a storage part 70a to 70c. The cleaning step is to execute a cleaning recipe S2 for cleaning the processing liquid that is attached to the substrate processing part 30 and the liquid drainage part 50 at the liquid processing step. The cleaning step includes a cleaning operation S3 for supplying a cleaning liquid to clean the substrate processing part 30 and the liquid drainage part 50, and a return operation S4 for supplying the processing liquid to replace the cleaning liquid that is attached to the substrate processing part 30 and the liquid drainage part 50 with the processing liquid. Thereby, it is possible to prevent or reduce degrading of a performance of liquid processing.

Although embodiments of the present disclosure have been explained above, the present disclosure is not limited to embodiments as described above, and a variety of modifications are allowed unless it departs from a spirit thereof. For example, although a case where a DIW is used for a cleaning liquid and a BHF is used for a processing liquid is illustrated in an embodiment as described above, a cleaning liquid and a processing liquid according to an embodiment are not limited to such examples.

According to an embodiment, it is possible to prevent or reduce degrading of a performance of liquid processing after a substrate processing part is cleaning-processed.

It should be considered that embodiments as disclosed herein are not limitative but are illustrative in any aspect. Indeed, the embodiments as described above can be implemented in various forms thereof. Furthermore, the embodiments as described above may be omitted, substituted, or modified in various forms thereof, without departing from the appended claims and the spirit thereof.

What is claimed is:

1. A substrate processing apparatus, comprising:
   a substrate processing part that supplies a processing liquid from a processing liquid supply part to a substrate that is mounted thereon to execute liquid processing thereof;
   a liquid drainage part that has a recovery channel that is connected to a storage part that stores the processing liquid and drains the processing liquid that is used for the liquid processing; and
   a control unit that is configured to execute a processing recipe for the liquid processing and a cleaning recipe for cleaning the substrate processing part and the liquid drainage part, wherein
   the control unit is further configured to execute a cleaning operation for supplying a cleaning liquid from a cleaning liquid supply part to clean the substrate processing part and the liquid drainage part as the cleaning recipe and subsequently execute a return operation for supplying the processing liquid from the processing liquid supply part to replace the cleaning liquid that is attached to the substrate processing part and the liquid drainage part with the processing liquid.

2. The substrate processing apparatus according to claim 1, wherein
   the processing recipe includes a sequence of processing for the substrate and a kind of the processing liquid.

3. The substrate processing apparatus according to claim 2, wherein
   the cleaning recipe is selected based on a kind of the processing liquid that is included in the processing recipe.

4. The substrate processing apparatus according to claim 3, wherein
   the cleaning recipe is selected based on the processing recipe for a subsequent process for the cleaning recipe.

5. The substrate processing apparatus according to claim 2, wherein
   the liquid drainage part has a drain part that discharges the processing liquid to an outside, and
   the control unit is further configured to discharge a liquid drainage that flows through the liquid drainage part, from the drain part to an outside, while the cleaning recipe is executed.

6. The substrate processing apparatus according to claim 2, wherein
the liquid drainage part has a concentration sensor that detects a concentration of the processing liquid, and
the control unit is further configured to end the return operation based on a concentration of the processing liquid that is detected by the concentration sensor.

7. The substrate processing apparatus according to claim 2, comprising
a gas supply part that supplies a gas to the substrate processing part and the liquid drainage part, wherein
the control unit is further configured to execute a gas purge operation for supplying the gas to purge the cleaning liquid that is attached to the substrate processing part and the liquid drainage part, after the cleaning operation is executed.

8. The substrate processing apparatus according to claim 2, comprising
a waiting part where the processing liquid supply part waits, wherein
a liquid drainage channel of the waiting part is connected to a liquid drainage channel of the liquid drainage part, and
the control unit is further configured to execute, for the waiting part, the cleaning recipe that is similar to that for the substrate processing part.

9. The substrate processing apparatus according to claim 2, comprising
a back surface supply part that discharges the processing liquid to a back surface side of the substrate, wherein
the control unit is further configured to execute the cleaning recipe for the back surface supply part.

10. The substrate processing apparatus according to claim 1, wherein
the liquid drainage part has a drain part that discharges the processing liquid to an outside, and
the control unit is further configured to discharge a liquid drainage that flows through the liquid drainage part, from the drain part to an outside, while the cleaning recipe is executed.

11. The substrate processing apparatus according to claim 1, wherein
the liquid drainage part has a concentration sensor that detects a concentration of the processing liquid, and
the control unit is further configured to end the return operation based on a concentration of the processing liquid that is detected by the concentration sensor.

12. The substrate processing apparatus according to claim 1, comprising
a gas supply part that supplies a gas to the substrate processing part and the liquid drainage part, wherein
the control unit is further configured to execute a gas purge operation for supplying the gas to purge the cleaning liquid that is attached to the substrate processing part and the liquid drainage part, after the cleaning operation is executed.

13. The substrate processing apparatus according to claim 12, wherein
the control unit is further configured to supply the gas to a site where the cleaning liquid is retained, as the gas purge operation.

14. The substrate processing apparatus according to claim 1, comprising
a waiting part where the processing liquid supply part waits, wherein
a liquid drainage channel of the waiting part is connected to a liquid drainage channel of the liquid drainage part, and
the control unit is further configured to execute, for the waiting part, the cleaning recipe that is similar to that for the substrate processing part.

15. The substrate processing apparatus according to claim 1, comprising
a back surface supply part that discharges the processing liquid to a back surface side of the substrate, wherein
the control unit is further configured to execute the cleaning recipe for the back surface supply part.

* * * * *